(12) United States Patent

Criminale et al.

(10) Patent No.: US 12,575,032 B2

(45) Date of Patent: Mar. 10, 2026

(54) DIAGNOSTIC DISC WITH A HIGH VACUUM AND TEMPERATURE TOLERANT POWER SOURCE

(71) Applicant: APPLIED MATERIALS, INC., Santa Clara, CA (US)

(72) Inventors: Phillip A. Criminale, Santa Clara, CA (US); Zhiqiang Guo, San Jose, CA (US); Andrew Myles, Sunnyvale, CA (US); Martin Perez-Guzman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 112 days.

(21) Appl. No.: 18/374,420

(22) Filed: Sep. 28, 2023

(65) Prior Publication Data

US 2024/0023246 A1 Jan. 18, 2024

Related U.S. Application Data

(62) Division of application No. 16/890,008, filed on Jun. 2, 2020, now Pat. No. 11,924,972.

(51) Int. Cl.
*G05B 13/02* (2006.01)
*H01L 21/66* (2006.01)
(Continued)

(52) U.S. Cl.
CPC ........... *H05K 1/183* (2013.01); *G05B 13/024* (2013.01); *H01L 21/67253* (2013.01);
(Continued)

(58) Field of Classification Search
CPC ......... H05K 1/183; H05K 2201/10151; H05K 2201/10371; H01L 21/67253;
(Continued)

(56) References Cited

U.S. PATENT DOCUMENTS 5,046,909 A * 9/1991 Murdoch .......... H01L 21/68728
414/935
6,239,590 B1 5/2001 Krivy et al.
(Continued)

FOREIGN PATENT DOCUMENTS

EP 4024034 A1 7/2022
JP 2020155489 A 9/2020
(Continued)

OTHER PUBLICATIONS

International Preliminary Report on Patentability for International Application No. PCT/US2021/035247, mailed Dec. 15, 2022, 7 Pages.

(Continued)

*Primary Examiner* — Elias Desta
(74) *Attorney, Agent, or Firm* — Lowenstein Sandler LLP

(57) ABSTRACT

A method includes establishing, by a diagnostic disc, a secure wireless connection with a computing system using a wireless communication circuit of the diagnostic disc before or after the diagnostic disc is placed into a processing chamber. The method further includes generating, by at least one non-contact sensor of the diagnostic disc, sensor data of a component disposed within the processing chamber. The method further includes storing the sensor data in a memory of the diagnostic disc. The method further includes wirelessly transmitting the sensor data to the computing system, using the wireless communication circuit. The method further includes terminating the secure wireless connection with the computing system and clearing the sensor data from the memory of the diagnostic disc.

9 Claims, 12 Drawing Sheets

(51) Int. Cl.

| | |
|---|---|
| *H01L 21/67* | (2006.01) |
| *H01L 21/687* | (2006.01) |
| *H05K 1/183* | (2026.01) |

(52) U.S. Cl.

CPC .. *H01L 21/67259* (2013.01); *H01L 21/68707* (2013.01); *H01L 21/68742* (2013.01); *H01L 22/34* (2013.01); *H05K 2201/10151* (2013.01); *H05K 2201/10371* (2013.01)

(58) Field of Classification Search

CPC ......... H01L 21/67259; H01L 21/68707; H01L 21/68742; H01L 22/34; G05B 13/024

See application file for complete search history.

(56) References Cited

U.S. PATENT DOCUMENTS

| | | | |
|---|---|---|---|
| 6,244,121 | B1 * | 6/2001 | Hunter .................. H01L 21/681 |
| | | | 73/866.5 |
| 6,807,503 | B2 | 10/2004 | Ye et al. |
| 6,820,028 | B2 | 11/2004 | Ye et al. |
| 6,830,650 | B2 | 12/2004 | Roche et al. |
| 6,902,646 | B2 | 6/2005 | Mahoney et al. |
| 7,127,362 | B2 | 10/2006 | Mundt |
| 7,135,852 | B2 | 11/2006 | Renken et al. |
| 7,283,255 | B2 | 10/2007 | Ramsey et al. |
| 7,289,230 | B2 | 10/2007 | Ramsey et al. |
| 7,331,250 | B2 | 2/2008 | Hunter |
| 7,434,485 | B2 | 10/2008 | Hunter |
| 7,659,734 | B2 | 2/2010 | Hawthorne et al. |
| 7,757,574 | B2 | 7/2010 | Renken et al. |
| 7,855,549 | B2 | 12/2010 | Renken et al. |
| 8,033,190 | B2 | 10/2011 | Renken et al. |
| 8,224,607 | B2 | 7/2012 | Sakhare et al. |
| 8,260,461 | B2 | 9/2012 | Krishnasamy et al. |
| 8,545,669 | B2 | 10/2013 | Mahoney et al. |
| 8,600,150 | B2 | 12/2013 | Lee et al. |
| 8,751,047 | B2 | 6/2014 | Rodnick et al. |
| 9,111,979 | B2 | 8/2015 | Fairbairn |
| 9,222,842 | B2 | 12/2015 | Sun et al. |
| 9,831,110 | B2 | 11/2017 | Francken et al. |
| 9,966,290 | B2 | 5/2018 | Senn |
| 10,014,198 | B2 | 7/2018 | Richardson |
| 10,041,868 | B2 | 8/2018 | Gottscho |
| 10,181,609 | B2 | 1/2019 | Eickhoff et al. |
| 10,460,966 | B2 | 10/2019 | Sun et al. |
| 11,271,930 | B2 | 3/2022 | Piel |
| 11,574,837 | B2 | 2/2023 | Cheng et al. |
| 11,924,972 | B2 | 3/2024 | Criminale et al. |
| 12,009,236 | B2 | 6/2024 | Pan et al. |

| | | | |
|---|---|---|---|
| 2005/0011611 | A1 | 1/2005 | Mahoney et al. |
| 2005/0034811 | A1 | 2/2005 | Mahoney et al. |
| 2005/0039852 | A1 | 2/2005 | Roche et al. |
| 2005/0224899 | A1 | 10/2005 | Ramsey et al. |
| 2008/0033673 | A1 | 2/2008 | Anton et al. |
| 2008/0228430 | A1 | 9/2008 | Bonciolini et al. |
| 2012/0271590 | A1 | 10/2012 | Sakhare et al. |
| 2016/0141154 | A1 | 5/2016 | Kamata et al. |
| 2016/0216185 | A1 | 7/2016 | Gottscho |
| 2017/0028560 | A1 | 2/2017 | Senn |
| 2017/0053819 | A1 | 2/2017 | Richardson |
| 2017/0263478 | A1 | 9/2017 | McChesney et al. |
| 2017/0326733 | A1 | 11/2017 | Ramachandran et al. |
| 2017/0365495 | A1 | 12/2017 | Sun et al. |
| 2018/0033673 | A1 | 2/2018 | Nemani et al. |
| 2018/0205103 | A1 | 7/2018 | Eickhoff et al. |
| 2019/0108986 | A1 | 4/2019 | Saitoh et al. |
| 2019/0318918 | A1 | 10/2019 | Saitoh et al. |
| 2019/0355557 | A1 | 11/2019 | Moriya et al. |
| 2019/0362994 | A1 * | 11/2019 | Liu ................... H01L 21/68764 |
| 2019/0386333 | A1 | 12/2019 | Shen et al. |
| 2020/0007536 | A1 | 1/2020 | Piel |
| 2020/0133431 | A1 | 4/2020 | Allore et al. |
| 2020/0393242 | A1 | 12/2020 | Vishwanath |
| 2021/0166960 | A1 | 6/2021 | Sugita et al. |
| 2021/0257234 | A1 | 8/2021 | Akiduki |
| 2021/0378100 | A1 | 12/2021 | Criminale et al. |
| 2021/0378119 | A1 | 12/2021 | Criminale |
| 2022/0013388 | A1 | 1/2022 | Daugherty et al. |
| 2023/0199992 | A1 | 6/2023 | Criminale et al. |
| 2023/0413446 | A1 | 12/2023 | Criminale et al. |
| 2024/0183656 | A1 | 6/2024 | Vishwanath et al. |

FOREIGN PATENT DOCUMENTS

| | | |
|---|---|---|
| KR | 20110091111 A | 8/2011 |
| TW | 201304240 A | 1/2013 |
| TW | 201901878 A | 1/2019 |
| WO | 2021021604 A1 | 2/2021 |
| WO | 2021022291 A1 | 2/2021 |

OTHER PUBLICATIONS

International Preliminary Report on Patentability for International Application No. PCT/US2021/035261, mailed Dec. 15, 2022, 7 Pages.

International Search Report and Written Opinion for International patent application No. PCT/US2021/035247 mailed Sep. 17, 2021, 11 pages.

International Search Report and Written Opinion dated Sep. 29, 2021, on application No. PCT/US2021/035261, 10 pages.

* cited by examiner

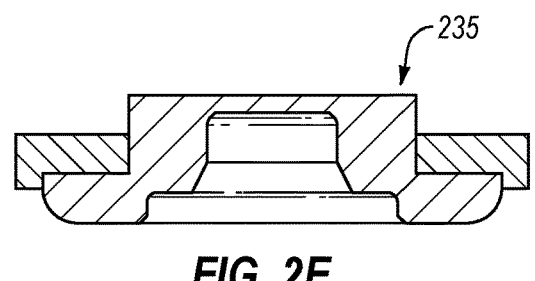
*FIG. 2E*
250
250
150
253
*FIG. 2F*
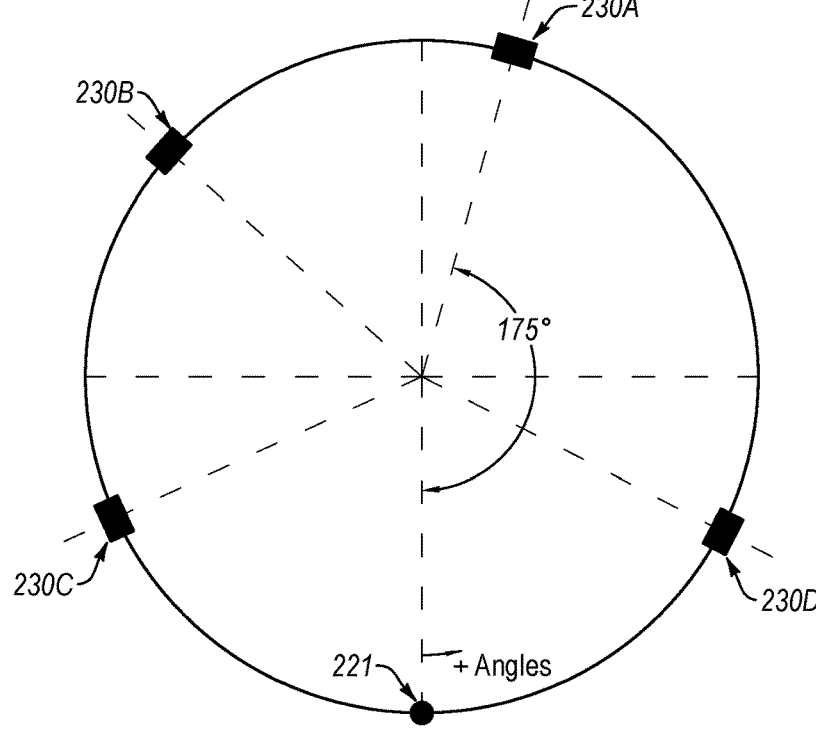
*FIG. 2G*

DIAGNOSTIC DISC WITH A HIGH VACUUM AND TEMPERATURE TOLERANT POWER SOURCE

RELATED APPLICATIONS

This application is a divisional application of U.S. non-Provisional application Ser. No. 16/890,008, filed on Jun. 2, 2020, and issued as U.S. Pat. No. 11,924,972, the entire contents of which is hereby incorporated by reference.

TECHNICAL FIELD

Some embodiments of the present disclosure relate, in general, to a diagnostic disc with at least one embedded non-contact sensor which allows in-situ measurements inside of a vacuum process chamber and can communicate wirelessly with a remote host. Some embodiments of the present disclosure relate, in general, to a power source that is tolerant to vacuum and high temperature and may be used in the diagnostic discs described herein.

BACKGROUND

Semiconductor substrates are commonly processed in vacuum processing systems. These systems include one or more processing chambers, each performing substrate processing operations such as etching, chemical vapor deposition, or physical vapor deposition, which can include heating or cooling the substrate and a plasma to assist the process. Such processing conditions (such as thermal cycling and corrosive plasma) may etch or erode exposed portions of chamber components within the processing chamber. Etched or eroded chamber components get regularly maintained (e.g., cleaned or replaced) after a number of process cycles (e.g., hours of processing, referred to as radio frequency (RF) hours) before these components contribute to inconsistent or undesirable process results, and before particles eroded from the components contaminate processing in the chamber resulting in particle defects on the substrate. Conventionally, to determine whether to begin maintenance on certain chamber components, a processing chamber is vented and opened to provide access to the various chamber components. This venting and disassembly are not only labor intensive, but hours of productivity of the substrate processing equipment are lost during the procedure. Additionally, exposure of the interior of the processing chamber may cause contamination of the interior, and so a lengthy requalification process for the processing chamber is performed after it is opened.

SUMMARY

Some embodiments described herein are directed to a diagnostic disc that includes a disc-shaped body, at least one protrusion extending outwardly from the disc-shaped body, a non-contact sensor attached to each of the at least one protrusion, and a cover. In certain embodiments, the disc-shaped body includes raised walls that encircle an interior of the disc-shaped body, wherein the raised walls of the disc-shaped body define a cavity of the disc-shaped body. In certain embodiments, the diagnostic disc further includes a printed circuit board (PCB) positioned within the cavity on the disc-shaped body, a circuitry disposed on the PCB and coupled to each non-contact sensor, a power source disposed on the PCB, and a wireless charger disposed on the PCB. In certain embodiments, the circuitry disposed on the PCB includes at least a wireless communication circuit and a memory. In certain embodiments, the cover of the diagnostic disc is positioned over the cavity of the disc-shaped body, wherein the cover shields at least portions of the PCB, the circuitry, the power source, and the wireless charger within the cavity from an external environment.

Some embodiments described herein are directed to an operational method of a diagnostic disc. In certain embodiments, the method includes establishing, by a diagnostic disc, a secure wireless connection with a computing system using a wireless communication circuit of the diagnostic disc before or after the diagnostic disc is placed into a processing chamber. In certain embodiments, the method further includes generating, by at least one non-contact sensor of the diagnostic disc, sensor data of a component disposed within the processing chamber. In certain embodiments, the method further includes storing the sensor data in a memory of the diagnostic disc. In certain embodiments, the method further includes wirelessly transmitting the sensor data to the computing system, using the wireless communication circuit. In certain embodiments, the method further includes terminating the secure wireless connection with the computing system. In certain embodiments, the method further includes clearing the sensor data from the memory of the diagnostic disc.

Some embodiments described herein are directed to an operational method of a computing system that communicates wirelessly with a diagnostic disc. In certain embodiments, the method includes establishing, by a computing system, a wireless connection with a diagnostic disc. In certain embodiments, the method further includes causing a robot arm within a transfer chamber to place the diagnostic disc into a processing chamber. In certain embodiments, the method further includes causing the diagnostic disc to generate sensor data of a component of the processing chamber using one or more non-contact sensor of the diagnostic disc. In certain embodiments, the method further includes receiving, by the computing system, the sensor data from the diagnostic disc via the wireless connection. In certain embodiments, the method further includes analyzing, by the computing system, the sensor data to determine at least one of alignment, concentricity, degree of cleanliness, or degree of erosion of the component. In certain embodiments, the method further includes at least one of: in response to determining that the alignment or concentricity is skewed, initiating automated correction of the alignment or concentricity of the component, in response to determining that the degree of cleanliness meets a contamination threshold, initiating automated cleaning of the component, or in response to determining that the degree of erosion meets an end-of-life threshold, initiating automated replacement of the component.

Some embodiments described herein are directed to a power unit that includes a printed circuit board (PCB), a power source coupled to the PCB, and a casing that encapsulates at least the power source. In certain embodiments, the PCB includes a power management circuitry disposed thereon. In certain embodiments, the power source has a height of up to about 6 mm. In certain embodiments, the power unit is configured to operate at a vacuum of about 0.1 mTorr to about 50 mTorr and temperatures of about −20° C. to about 120° C. without rupturing or exploding.

Some embodiments described herein are directed to a diagnostic disc that includes a disc-shaped body, a printed circuit board (PCB), a power source coupled to the PCB, a casing that encapsulates at least the power source, and a cover positioned over the PCB and the power source. In certain embodiments, the power source has a height of up to about 6 mm. In certain embodiments, the power source is operable at a vacuum of about 0.1 mTorr to about 50 mTorr and temperatures of about –20° C. to about 120° C. without rupturing or exploding. In certain embodiments, the cover shields the PCB and the power source within an interior formed by the disc-shaped body and the cover from an environment outside of the disc-shaped body.

Some embodiments described herein are directed to an operational method of a diagnostic disc. In certain embodiments, the method includes establishing, by a diagnostic disc, a secure wireless connection with a computing system using a wireless communication circuit of the diagnostic disc before or after the diagnostic disc is placed into a processing chamber. In certain embodiments, the method further includes generating, at a vacuum of about 0.1 mTorr to about 50 mTorr and temperatures of about –20° C. to about 120° C., by at least one non-contact sensor of the diagnostic disc, sensor data of a component disposed within the processing chamber. In certain embodiments, the method further includes wirelessly transmitting the sensor data to the computing system, using the wireless communication circuit. In certain embodiments, the diagnostic disc includes a disc-shaped body, a printed circuit board (PCB), a power source coupled to the PCB, a casing that encapsulates at least the power source, and a cover positioned over the PCB and the power source. In certain embodiments, the power source has a height of up to about 6 mm. In certain embodiments, the power source is operable at a vacuum of about 0.1 mTorr to about 50 mTorr and temperatures of about –20° C. to about 120° C. without rupturing or exploding. In certain embodiments, the cover shields the PCB and the power source within an interior formed by the disc-shaped body and the cover from an environment outside of the disc-shaped body.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A1 illustrates a blown up view of one protrusion and a non-contact sensor attached thereto according to embodiments of the disclosure.

FIG. 2E illustrates a side, cross-section view of kinematic couplings in the diagnostic disc used to engage wafer lift pins of an electrostatic chuck (ESC) according to one embodiment of the disclosure.

FIG. 2F illustrates a wafer lift pin setting the diagnostic disc down on the ESC and low contact area between the kinematic couplings and the ESC according to one embodiment of the disclosure.

FIG. 2G illustrates a schematic depicting positions of four non-contact sensors on a diagnostic disc according to embodiments of the disclosure.

DETAILED DESCRIPTION OF EMBODIMENTS

Figure 1A:
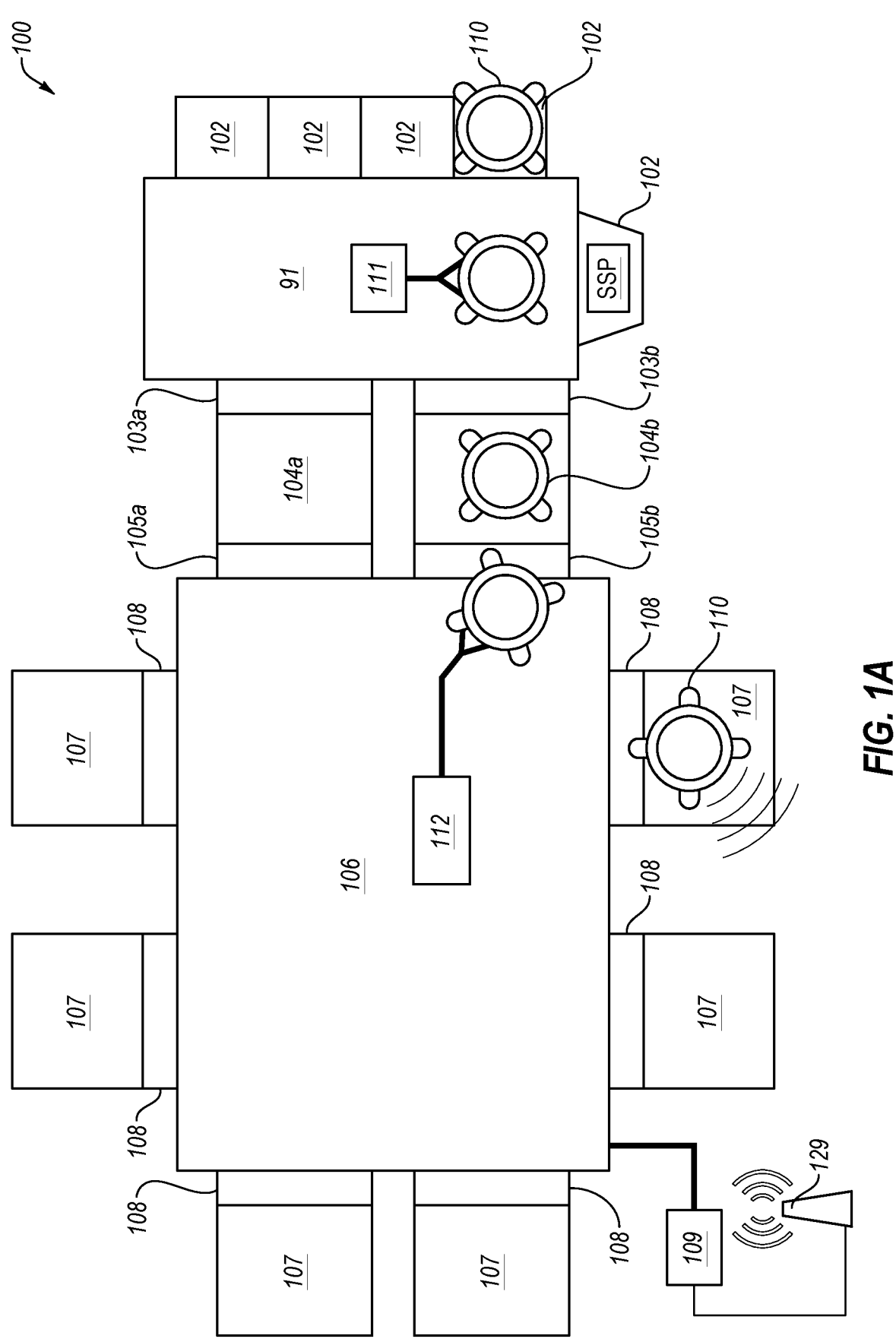
FIG. 1A illustrates a simplified top view of an example processing system, according to embodiments of the disclosure.

Embodiments of the present disclosure provide a diagnostic disc and method for conducting in-situ diagnostic scans of components within a processing chamber without venting the processing chamber or opening the processing chamber's lid. Such embodiments benefit from an in-situ diagnostics method to determine what maintenance, if any, is to be implemented to the component that is being scanned within the processing chamber. Such in-situ diagnostics provide improved process results without the disruption to processing and/or disassembly of a substrate processing system or processing chamber. This process saves precious man hours as well as avoids down time of the substrate processing system. Additionally, embodiments prevent exposure of an interior of the processing chamber to atmosphere or an external environment, which mitigates contamination of the processing chamber.

In-situ diagnostic scans may generate, through the use of non-contact sensors (e.g., cameras, position sensors and the like) on a diagnostic disc, sensor data about various components within the processing chamber. The sensor data may be wirelessly transmitted, using the diagnostic disc, to a computing system that could analyze the sensor data and determine subsequent actions. For instance, the generated sensor data may provide information regarding a component such as: placement (alignment and/or concentricity and/or gap measurement), degree of cleanliness, degree of erosion, metrology data, whether the component is broken, whether the component is stuck, and so on. Based on this sensor data, the computing system may initiate automatic placement correction of a component, automatic cleaning of the component, automatic replacement of a component, and so on.

The term "in-situ" herein means "in place" in the sense that the processing chamber remains intact and the processing chamber need not be disassembled or exposed to atmosphere in order to carry out the disclosed diagnostic scans. In-situ diagnostic scans may be performed between processing of substrates.

The ability to conduct diagnostic scans in-situ and in some instances implement subsequent maintenance in-situ improves yield of processed wafers and tool time utilization in a customer fabrication facility (fab). Furthermore, in-situ diagnostics enable the condition of various components within a processing chamber to be tracked, and enable initiation of proper maintenance for the component at an appropriate time based on empirical data rather than based on guesswork.

The diagnostic discs described herein may be able, in certain embodiments, to communicate with a designated computing system. In embodiments, the diagnostic discs establish a secure wireless connection with the designated computing system using a wireless communication circuit within the diagnostic disc, generate sensor data of a component disposed within a processing chamber using non-contact sensors on the diagnostic disc, optionally store the sensor data in the memory of the diagnostic disc, wirelessly transmit the sensor data to the designated computing system using the wireless communication circuit, terminate the secure wireless connection with the designated computing system, and clear the sensor data from the memory of the diagnostic disc. In certain embodiments, the diagnostic disc includes a security feature according to which it may be operable by receiving a software from the designated computing system after a secure wireless connection with the designated computing system has been established and upon terminating said secure wireless connection, the diagnostic disc may wipe itself (i.e., sensor data and, if applicable, software received from the designated computing system) so that the sensor data generated by it cannot be extracted. If the diagnostic disc received a software from the designated computing system, such software may respond to commands from its designated computing system.

The diagnostic discs described herein may include a disc-shaped body including raised walls encircling an interior of the disc-shaped body, wherein the raised walls of the disc-shaped body define a cavity of the disc-shaped body. At least one protrusion may extend approximately horizontally from the disc-shaped body. At least one non-contact sensor may be attached to each of the at least one protrusion. The diagnostic disc may further include built-in illumination. The cavity of the disc-shaped body may include a printed circuit board (PCB) having at least a power source, a wireless charger, and circuitry disposed thereon.

The power source in the disc shaped body may be tolerant to vacuum and/or high temperature such as upon exposure to vacuum and/or high temperature, it will not deform, rupture, or explode. The power source, by itself or with the PCB, may further be encapsulated in a hermetically sealed casing to minimize outgassing and/or not contaminate the process chamber. If the power source fails and ruptures at vacuum and/or high temperature, the materials of constructions of the power source may remain contained in the casing rather than contaminate the processing chamber or the diagnostic disc. The power source may also be free of heavy metals (such as Lithium) so that even if the power source fails and ruptures at vacuum and/or high temperature, contaminating the diagnostic disc and/or the processing chamber, the materials of construction of the power source can be readily cleaned from a processing chamber or from a diagnostic disc.

The power source may be placed in a cavity formed by the disc shaped body and a cover of the diagnostic discs described herein so as to separate the power source from the high vacuum, high temperature, corrosive environment that the diagnostic disc may operate in. Keeping the power source in the internal cavity of the diagnostic disc and further encapsulated within a casing (e.g., a semi-rigid insulator) may beneficially control the egress or leakage of electrolyte or other materials in the power source construction to the surrounding environment (minimizing potential stress through contamination of devices proximate to the power source).

The power source may include, in certain embodiments, a plurality of capacitors arranged in parallel, in series, or in a combination thereof. As such, the power source may be scalable and may be designed to achieve target attributes such as output voltage, energy density, run time, charge time to run time ratio, internal series resistivity, dimensions (e.g., width, length, and height), weight, operation parameters (e.g., temperature and pressure), capacitance, charge current, discharge current, discharge voltage, leakage current, minimum stored energy, and the like. In certain embodiments, the power source may be charged wirelessly or through a wire. In certain embodiments, the power source may have a charge time to run time ratio of about 1:2 to about 3:2 so as to charge quickly enough while also being able to sufficiently power any of the diagnostic discs described herein during their operation for a duration of about 15 minutes to about 60 minutes. The charge time to run time ratio should not be construed as limiting. In certain embodiments, the charge time to run time ratio may range from any of about 1:100, about 1:75, about 1:50, about 1:25, about 1:10, about 1:10, about 1:5, or about 1:1 to any of about 5:1, about 10:1, about 15:1, about 25:1, about 50:1, about 75:1, or about 100:1, or any sub-range or single value therein.

In embodiments, the power source is non-toxic, can travel on an airplane, is durable so as to provide for a high life cycle, and/or is removeable for convenient maintenance and/or replacement.

The dimensions and mass of the diagnostic discs described herein may be similar to that of wafers that undergo processing in the wafer processing system to allow the diagnostic discs to be transferred through the wafer processing system in the same manner that wafers are transferred through the wafer processing system. The materials of construction of the diagnostic disc and the coating disposed thereon may be resistant to the vacuum and/or high temperature and/or corrosive environment of a processing chamber.

The at least one protrusion and at least one non-contact sensor on the diagnostic discs described herein may be positioned in locations that allow the diagnostic disc to be picked up and transferred through the wafer processing system using existing robots (e.g., existing factory interface robots and existing transfer chamber robots). Another consideration for the positioning of the protrusions and at least one non-contact sensor may be to provide a clear line of sight from the at least one non-contact sensor to at least a portion of the component being scanned.

FIG. 1A illustrates a simplified top view of an example processing system 100, according to embodiments of the disclosure. The processing system 100 includes a factory interface 91 to which a plurality of substrate cassettes 102 (e.g., front opening unified pods (FOUPs) and a side storage pod (SSP)) may be coupled for transferring substrates (e.g., wafers such as silicon wafers) into the processing system 100. In embodiments, the substrate cassettes 102 include, in addition to wafers, diagnostic discs 110. Diagnostic discs 110 may be used to generate data (such as, without limitation, alignment, concentricity, degree of erosion, degree of cleanliness, metrology data, whether a component is broken or stuck, and so on) about various components within one or more processing chamber 107. In one embodiment, diagnostic discs 110 may be used to generate data related to the placement or maintenance of a process kit ring (not shown). The factory interface 91 may also transfer the diagnostic discs 110 into and out of the processing system 100 using the same functions for transferring wafers as will be explained. Similarly, factory interface 91 may be used to transfer certain replacement components (e.g., process kit rings) into and out of the processing system 100 using the same functions for transferring wafers.

The processing system 100 may also include first vacuum ports 103a, 103b that may couple the factory interface 91 to respective stations 104a, 104b, which may be, for example, degassing chambers and/or load locks. Second vacuum ports 105a, 105b may be coupled to respective stations 104a, 104b and disposed between the stations 104a, 104b and a transfer chamber 106 to facilitate transfer of substrates into the transfer chamber 106. The transfer chamber 106 includes multiple processing chambers 107 (also referred to as process chambers) disposed around the transfer chamber 106 and coupled thereto. The processing chambers 107 are coupled to the transfer chamber 106 through respective ports 108, such as slit valves or the like.

The processing chambers 107 may include one or more of etch chambers, deposition chambers (including atomic layer deposition, chemical vapor deposition, physical vapor deposition, or plasma enhanced versions thereof), anneal chambers, and the like. Processing chambers 107 may include components which occasionally undergo replacement, correction of alignment and/or concentricity, maintenance, and so on. Presently, certain actions within a processing chamber (e.g., replacement of certain components, correction of alignment and/or concentricity of certain components, assessment of degree of erosion, or assessment of degree of cleanliness and initiating cleaning of a processing chamber) may include disassembly of a processing chamber by an operator to facilitate said action. The processing system 100 is configured to facilitate some of said actions without disassembly of a processing chamber 107 by an operator.

In various embodiments, the factory interface 91 includes a factory interface robot 111. The factory interface robot 111 may include a robot arm, and may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm. The end effector may be configured to pick up and handle specific objects, such as wafers. Alternatively, the end effector may be configured to handle objects such as diagnostic discs. In certain embodiments, the end effector may be configured to handle chamber components needing maintenance or placement correction, such as process kit rings. The factory interface robot 111 may be configured to transfer objects between substrate cassettes 102 (e.g., FOUPs and/or SSP) and stations 104a, 104b.

The transfer chamber 106 includes a transfer chamber robot 112. The transfer chamber robot 112 may include a robot arm with an end effector at an end of the robot arm. The end effector may be configured to handle particular objects, such as wafers and diagnostic discs. The transfer chamber robot 112 may be a SCARA robot, but may have fewer links and/or fewer degrees of freedom than the factory interface robot 111 in some embodiments.

A controller 109 (also referred to herein as a "computing system" or a "designated computing system") may control various aspects of the processing system 100 and may include or be coupled to a wireless access point (WAP) device 129. The WAP device 129 may include wireless technology and one or more antenna with which to communicate with the diagnostic discs 110. The controller 109 may be and/or include a computing system such as a personal computer, a server computer, a programmable logic controller (PLC), a microcontroller, and so on. The controller 109 may include one or more processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like.

Although not illustrated, the controller 109 may include a data storage device (e.g., one or more disk drives and/or solid state drives), a main memory, a static memory, a network interface, and/or other components. The controller 109 may execute instructions to perform any one or more of the methodologies and/or embodiments described herein, including image or sensor data processing and analysis, image processing algorithm, machine learning (ML) algorithms that generate one or more trained machine learning model, deep ML algorithms, and other imaging algorithms for analyzing sensor data in detecting, for example, alignment, concentricity, degrees of erosion, degrees of cleanliness of components within the processing chambers 107, whether components within the processing chamber are stuck or broken, and so on. The instructions may be stored on a computer readable storage medium, which may include the main memory, static memory, secondary storage and/or processing device (during execution of the instructions). In some embodiments, training data to train a ML model may be obtained by imaging, using a scanning device or other type of sensor or camera, components that have already been subjected to some type of maintenance (placement correction, replacement, cleaning, and so on).

Figure 1B:
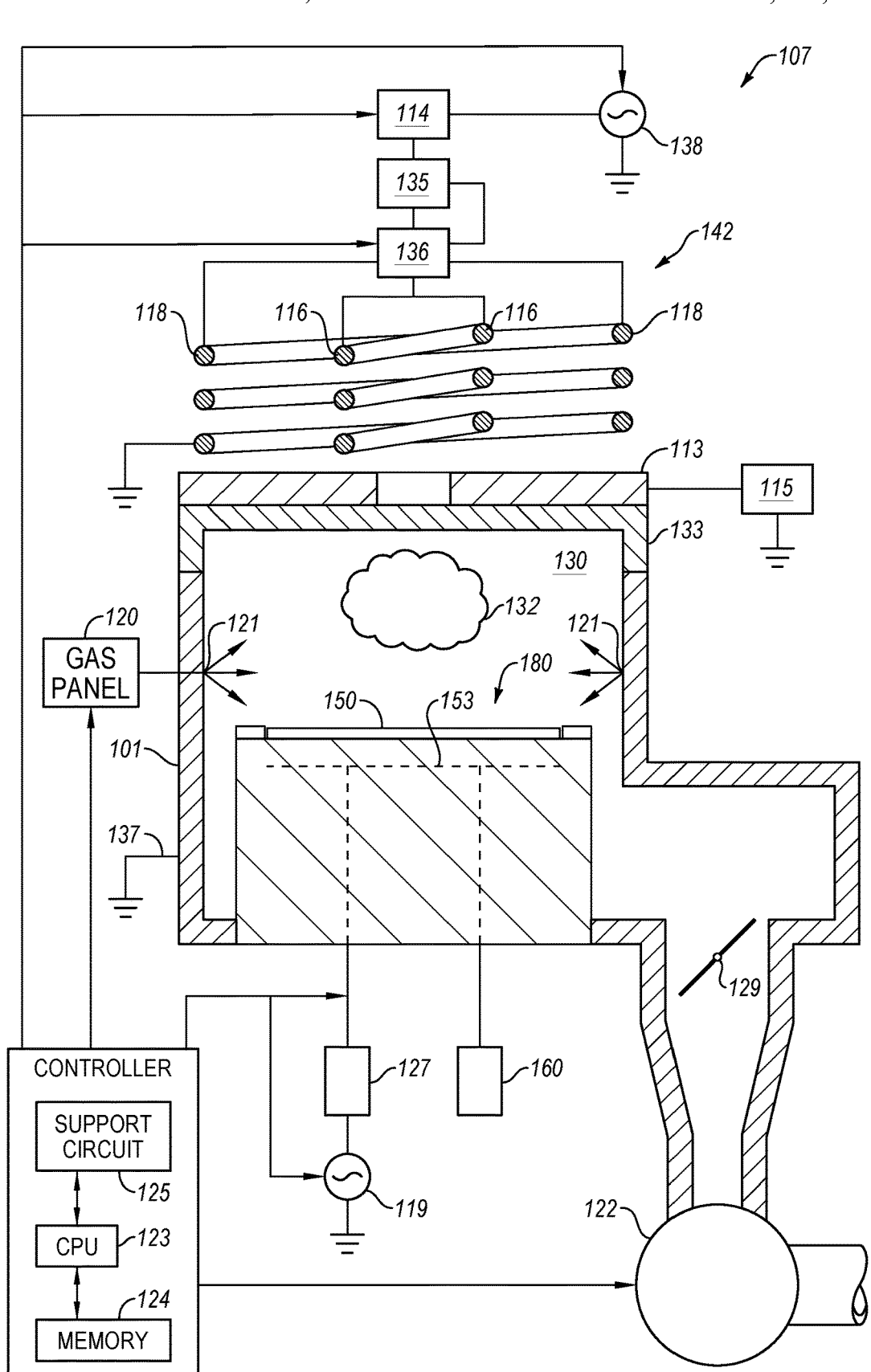
FIG. 1B illustrates a schematic cross-sectional side view of a processing chamber of FIG. 1A according to embodiments of the disclosure.

FIG. 1B illustrates a schematic cross-sectional side view of a processing chamber 107 of FIG. 1A according to embodiments of the disclosure. The processing chamber 107 includes a chamber body 101 and a lid 133 disposed thereon that together define an inner volume 130. The chamber body 101 is typically coupled to an electrical ground 137. A substrate support assembly 180 is disposed within the inner volume to support a substrate thereon during processing. The process chamber 107 also includes an inductively coupled plasma apparatus 142 for generating a plasma 132 within the process chamber 107, and a controller 155 adapted to control examples of the process chamber 107.

The substrate support assembly 180 includes one or more electrodes 153 coupled to a bias source 119 through a matching network 127 to facilitate biasing of the substrate during processing. The bias source 119 may illustratively be a source of up to about 1000 W (but not limited to about 1000 W) of RF energy at a frequency of, for example, approximately 13.56 MHz, although other frequencies and powers may be provided as desired for particular applications. The bias source 119 may be capable of producing either or both of continuous or pulsed power. In some examples, the bias source 119 may be a DC or pulsed DC source. In some examples, the bias source 119 may be capable of providing multiple frequencies. The one or more electrodes 153 may be coupled to a chucking power source 160 to facilitate chucking of the substrate during processing.

The inductively coupled plasma apparatus 142 is disposed above the lid 133 and is configured to inductively couple RF power into the process chamber 107 to generate a plasma within the process chamber 107. The inductively coupled plasma apparatus 142 includes first and second coils 116, 118, disposed above the lid 133. The relative position, ratio of diameters of each coil 116, 118, and/or the number of turns in each coil 116, 118 can each be adjusted as desired to control the profile or density of the plasma being formed. Each of the first and second coils 116, 118 is coupled to an RF power supply 138 through a matching network 114 via an RF feed structure 136. The RF power supply 138 may illustratively be capable of producing up to about 4000 W (but not limited to about 4000 W) at a tunable frequency in a range from 50 kHz to 13.56 MHz, although other frequencies and powers may be utilized as desired for particular applications.

In some examples, a power divider 135, such as a dividing capacitor, may be provided between the RF feed structure 136 and the RF power supply 138 to control the relative quantity of RF power provided to the respective first and second coils. In some examples, the power divider 135 may be incorporated into the matching network 114.

A heater element 113 may be disposed on top of the lid 133 to facilitate heating the interior of the process chamber 107. The heater element 113 may be disposed between the lid 133 and the first and second coils 116, 118. In some examples, the heater element 113 may include a resistive heating element and may be coupled to a power supply 115, such as an AC power supply, configured to provide sufficient energy to control the temperature of the heater element 113 within a desired range.

During operation, a substrate, such as a semiconductor wafer or other substrate suitable for plasma processing, is placed on the substrate support assembly 180 and process gases supplied from a gas panel 120 through entry ports 121 into the inner volume of the chamber body 101. The process gases are ignited into the plasma 132 in the process chamber 107 by applying power from the RF power supply 138 to the first and second coils 116, 118. In some examples, power from a bias source 119, such as an RF or DC source, may also be provided through a matching network 127 to electrodes 153 within the substrate support assembly 180. The pressure within the interior of the process chamber 107 may be controlled using a valve 129 and a vacuum pump 122. The temperature of the chamber body 101 may be controlled using liquid-containing conduits (not shown) that run through the chamber body 101.

The process chamber 107 includes a controller 155 to control the operation of the process chamber 107 during processing. The controller 155 comprises a central processing unit (CPU) 123, a memory 124, and support circuits 125 for the CPU 123 and facilitates control of the components of the process chamber 107. The controller 155 may be one of any form of general-purpose computer processor that can be used in an industrial setting for controlling various chambers and sub-processors. The memory 124 stores software (source or object code) that may be executed or invoked to control the operation of the process chamber 107 in the manner described herein.

The diagnostic discs described in further detail below may generate sensor data of various components within processing chamber 107, such as, without limitations, substrate support assembly 180, electrostatic chuck 150, a ring (e.g., a process kit ring or single ring), a chamber wall, a base, a gas distribution plate, a showerhead, gas lines, gas entry ports 121, a nozzle, a chamber lid 133, a liner, a liner kit, a shield, a plasma screen, a plasma generation unit 142, a radiofrequency feed structure 136, an electrode 153, a diffuser, a flow equalizer, a cooling base, a chamber viewport, and so on. Some exemplary sensor data for these components may include, without limitations, alignment, concentricity, degree of erosion, degree of cleanliness, metrology data, whether a component is broken or stuck, whether maintenance on a component is due, and the like.

Figure 2A:
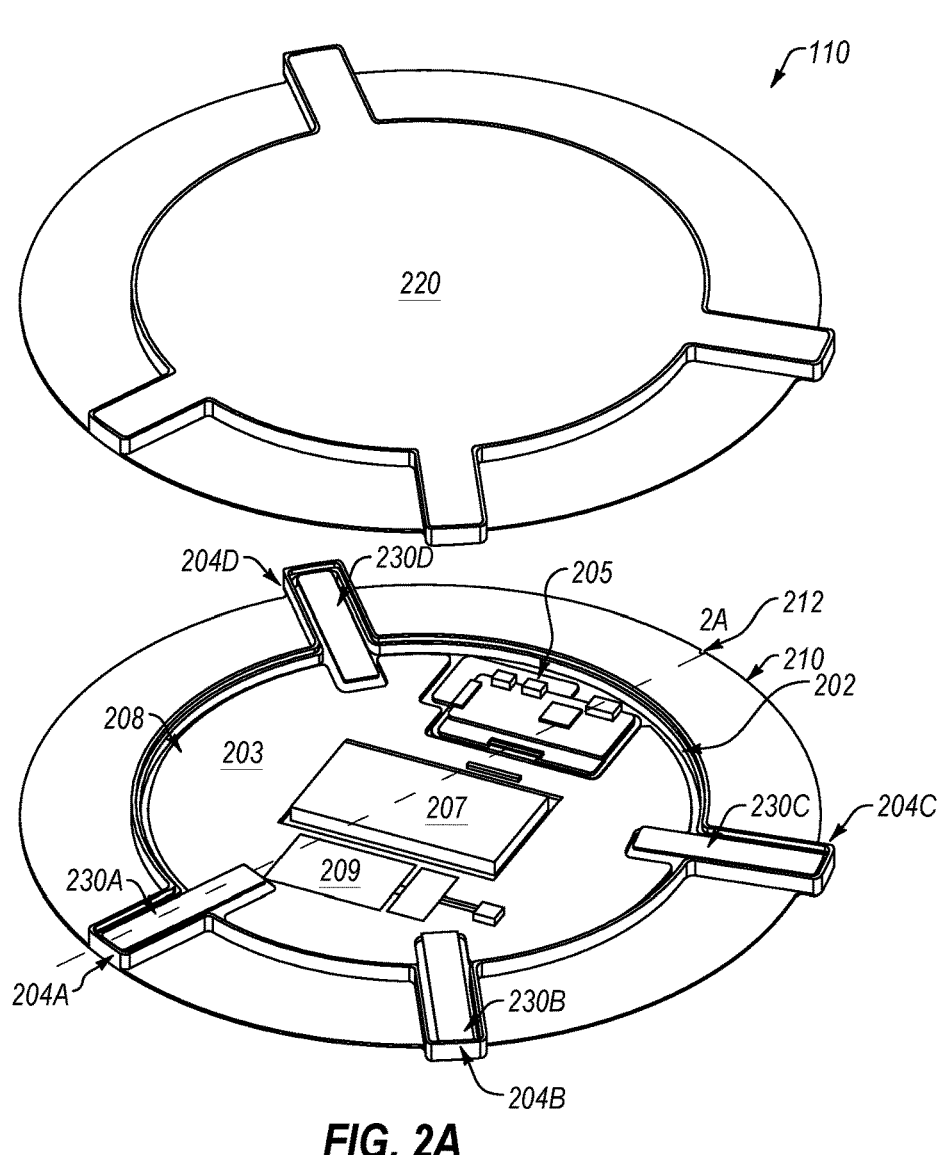
FIG. 2A illustrates a perspective view of an open diagnostic disc according to embodiments of the disclosure.

FIG. 2A illustrates a perspective view of an open diagnostic disc 110 according to embodiments of the disclosure. The diagnostic disc 110 may include a disc-shaped body 210 with raised walls 202 that encircle an interior of the disc-shaped body 210, and at least one protrusion extending outwardly from the disc-shaped body 210. The raised walls 202 may extend to the at least one protrusion in embodiments. Each of the protrusions extend horizontally, or approximately horizontally, from the disc-shaped body 210 and are positioned perpendicularly, or approximately perpendicularly, to the circumference of the disc-shaped body 210.

In certain embodiments, there are four protrusions, e.g., a first protrusion 204A, a second protrusion 204B, a third protrusion 204C, and a fourth protrusion 204D. In the depicted embodiment, the four protrusions are spaced apart in positions that allow an end effector of a robot arm of transfer robot 112 to pick up the diagnostic disc and place it in a processing chamber 107. The four protrusions may also be positioned in a manner that maintains a clear line of sight between the non-contact sensors attached to each protrusion and the component that is being diagnosed when the diagnostic disc is held by the end effector, or when the diagnostic disc is placed on top of wafer lift pins (as depicted in FIGS. 2E-2F and in FIG. 7B).

The diagnostic disc 110 includes greater or fewer numbers of protrusions in various embodiments. In an alternative embodiment, the diagnostic disc 110 has no protrusions and is shaped as a solid disc similar to a wafer. In certain embodiments, one or more protrusions protrudes outward from the perimeter of disc-shaped body 210 (e.g., as shown in the bottom view depicted in FIG. 2B with respect to second protrusion 204B, third protrusion 204C, and fourth protrusion 204D). In certain embodiments, one or more of the protrusions does not protrude outward from the perimeter of disc-shaped body 210 and is flush with the perimeter of disc-shaped body 210 (e.g., as shown in the bottom view depicted in FIG. 2B with respect to first protrusion 204A).

In certain embodiments, the raised walls 202 of the disc-shaped body 210 define a cavity 208 of the disc-shaped body. In embodiments, the diagnostic disc 110 further includes a printed circuit board (PCB) 203 disposed within cavity 208 formed by the raised walls 202. A number of components, such as circuitry 205, a power source 207, and a wireless charger 209 (e.g., a QI charger), may be disposed on the PCB 203 and/or within cavity 208. The circuitry 205 may include a number of components, such for example, a wireless communication circuit and a memory. The circuitry 205 may be coupled to at least one non-contact sensor 230 (shown in FIG. 2B) attached to each of the at least one protrusions of disc-shaped body 210. In certain embodiments, one or more of these components may not be inside cavity 208 but rather may be external to the diagnostic disc and may be coupled to the diagnostic disc via wire(s).

The power source 207 may include a battery (such as a lithium-ion polymer battery) or an alternative power source (such as an ultra-capacitor type power source, described in further detail below with respect to FIGS. 3A-3B).

In certain embodiments, the diagnostic disc 110 may further include a cover positioned over the cavity 208 of the disc-shaped body 210. The cover 220 may shield at least portions of the PCB 203 and certain components inside cavity 208 from an external environment. In certain embodiments, the cover 220 may shield at least portions of the PCB 203, the circuitry 205, the power source 207, and the wireless charger 209 within the cavity 208 from an external environment. The cover may be designed with various pockets to create clearance between components on the PCB 203. For instance, the cover may include a cutout for wireless charger 209 placement, for the circuitry 205 placement, for the power source 207 placement, and optionally an additional cavity for future circuitry changes. In certain embodiments, cover 220 may be used to vacuum seal the PCB 203, the circuitry 205, the power source 207, and the wireless charger 209 within the cavity 208 from an external environment.

Figure 2B:
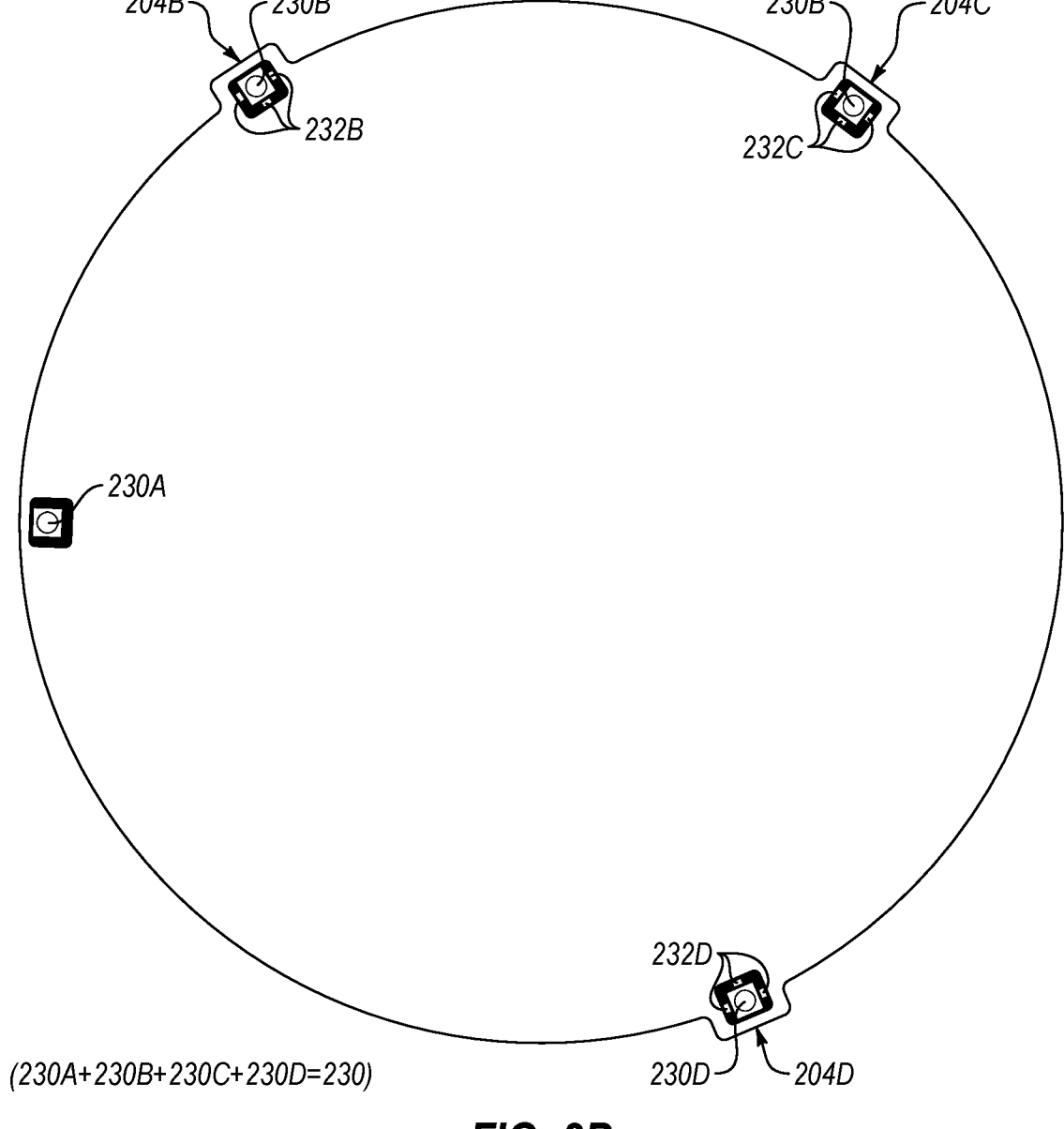
FIG. 2B illustrates a bottom view of a diagnostic disc according to embodiments of the disclosure.

FIG. 2B illustrates a bottom view of a diagnostic disc according to embodiments of the disclosure. In various embodiments, a non-contact sensor is attached to each of the at least one protrusion. For example, the diagnostic disc 110 may further include a number of non-contact sensors such as a first non-contact sensor 230A, a second non-contact sensor 230B, a third non-contact sensor 230C, and a fourth non-contact sensor 230D attached to the four protrusions 204A, 204B, 204C, and 204D, respectively. In certain embodiments, each non-contact sensor may be attached to an underside of its respective protrusion, as depicted in FIG. 2B.

The non-contact sensor may be attached to each of the at least one protrusions via any suitable attachment mechanism, such as, without limitations, via epoxy, via helicoil, and the like. In certain embodiments, the non-contact sensor is attached to each of the at least one protrusions via an attachment mechanism that enables easy maintenance (e.g., easy removal and replacement of the non-contact sensor upon its failure). In certain embodiments, the non-contact sensor and/or the attachment mechanism that it is coupled to may have a width enabling it to be supported by a portion of raised walls 202. For instance, FIG. 2A1 illustrates a blown up view of protrusion 204D. In FIG. 2A1, the portion of raised wall 202 extending from the circumference of cavity 208 towards protrusions 204D supports non-contact sensor 230D and/or the attachment mechanism that is coupled to non-contact sensor 230D via support tabs 206A and 206B.

In the embodiment with no protrusions, each non-contact sensor may be attached to an underside of the periphery of the diagnostic disc 110. In certain embodiments, each non-contact sensor may be attached to other sides of the diagnostic disc, such as, without limitations, the upside of each protrusion (e.g., on the cover 220), the edges of diagnostic disc 110 (e.g., on the cover 220 or on the perimeter of the disc-shaped body 210), and so on.

Each non-contact sensor can be oriented in a direction that allows the non-contact sensor to generate sensor data of a component. For instance, each non-contact sensor may be oriented over an edge ring, a process ring, an electrostatic chuck, and the like to generate sensor data for the alignment or concentricity of the edge ring or a process ring (e.g., based on a gap measurement between them or the gap between the electrostatic chuck and the process ring) or sensor data for the degree of erosion or cleanliness of the edge ring or process kit ring. In another example, each non-contact sensor may be oriented in a direction that allows the non-contact sensor to generate sensor data of a processing chamber lid or showerhead. In certain embodiments, the non-contact sensors may be oriented to form a clear line of sight towards certain chamber components. In alternative embodiments, the entire diagnostic disc may be oriented to form a clear line of sight towards certain chamber components. For instance, a diagnostic disc may be placed upside down on a wafer lift pin so that non-contact sensor attached to the underside of each protrusion have a clear line of sight of the top side of a processing chamber (for example to conduct a diagnostic scan of a showerhead or a process chamber lid).

Each non-contact sensor may be coupled to the circuitry 205, e.g., via a connection on the PCB 203. Each non-contact sensor may be configured to acquire sensor data (e.g., positioning, texture, and/or roughness information indicative of alignment, concentricity, cleanliness, erosion, and the like) of a component being used in any given processing chamber 107. The wireless communication circuit may include or be coupled to an antenna in order to wirelessly transmit the sensor data to the controller 109. In certain embodiments, the sensor data is stored temporarily in the memory of the diagnostic disc, wirelessly transmitted to the controller 109 using the wireless communication circuit, and cleared from the memory of the diagnostic disc as soon as the secure wireless connection of the diagnostic disc with the controller is terminated.

In varying embodiments, the non-contact sensor is an image sensor such as a camera zoom of at least four times magnification (e.g., 4×, 6×, 8×, or more). For example, the non-contact sensor may be or include a charge-coupled device (CCD) camera and/or a complementary metal oxide (CMOS) camera or a high resolution camera. Alternatively, the cameras may have other zoom capabilities. In certain embodiments, the non-contact sensor may be a position sensor. Alternatively, the non-contact sensor may be a miniature radar sensor that can scan a surface of a component. Further, the non-contact sensor may include an x-ray emitter (e.g., an x-ray laser) and an x-ray detector. The non-contact sensor may alternatively be or include one or more pairs of a laser emitter that generates a laser beam and a laser receiver that receives the laser beam. A sensor measurement may be generated by a pair of a laser emitter and a laser receiver when the laser beam is reflected off of a surface of the component. In certain embodiments, the non-contact sensor may further include illumination capabilities integrated thereon or be coupled to an illumination tool. These sensor measurements may be translated into sensor data by the circuitry 205 and/or the controller 109 in various embodiments.

In one embodiment, the non-contact sensor is a camera having a focusing range of about 25 mm to about 45 mm, about 30 mm to about 40 mm, about 33 mm to about 37 mm, or about 35 mm. The camera may have a resolution of at least 3 Megapixels, at least 4 Megapixels, or at least 5 Megapixels to enable the camera to focus on a certain component and get clear edges thereof. The camera may have a field of view (FOV) at about 25 mm to about 45 mm ranging from about 33,000 μm× about 24,000 μm to about 60,000 μm× about 45,000 μm. Suitable cameras may have an auto focus which may be operated by an auto focus algorithm in some embodiments. In certain embodiments, suitable cameras do not have an auto focus feature to extend the life of the power source (e.g., run time attained from the power source). In some embodiments, the camera may have any combination of the features described in Table 1 below.

TABLE 1

Specification for an Exemplary Camera for a Diagnostic Disc According to an Embodiment

| Available Controls | Current Value | Range |
|---|---|---|
| Brightness | 0 (50%) | –64 - 64 |
| Contrast | 32 (50%) | 0 - 64 |
| Saturation | 64 (50%) | 0 - 128 |
| Hue | 0 (50%) | –40 - 40 |
| White Balance Temperature, Auto | True | True \| False |
| Gamma | 100 (6%) | 72 - 500 |
| Gain | 0 (0%) | 0 - 100 |
| Power Line Frequency | 50 Hz | Disabled \| 50 Hz \| 60 Hz |
| White Balance Temperature | 4600 (48%) | 2800 - 6500 |
| Sharpness | 3 | 0 - 6 |
| Backlight Compensation | 1 | 0 - 2 |
| Exposure, Auto | Aperture Priority Mode | Manual Mode \| Aperture Priority Mode |
| Exposure (Absolute) | 157 (3%) | 1 - 5000 |
| Exposure, Auto Priority | True | True \| False |
| Focus (absolute) | 224 (21%) | 1 - 1023 |
| Focus, Auto | True | True \| False |

In varying embodiments, diagnostic disc 110 may further include at least one illumination component attached to each of the at least one protrusions. For instance, in the embodiment depicted in FIG. 2B, illumination component 232B is attached to protrusion 204B, illumination component 232C is attached to protrusion 204C, and illumination component 232D is attached to protrusion 204D. While non-contact sensor 230A in the embodiment depicted in FIG. 2B is not accompanied with an illumination component, in certain embodiments, non-contact sensor 230A is also accompanied with an illumination component. The circuitry 205 disposed on PCB 203 may be coupled each of the at least one illumination component (e.g., 232A, 232B, 232C). Each illumination component may be configured to illuminate at least a portion of a component being used in any given processing chamber 107 so that each non-contact sensor could acquire sensor data of the portion of the component that is being illuminated. An exemplary illumination component may include, without limitations, a light emitting diode (LED).

Figure 2C:
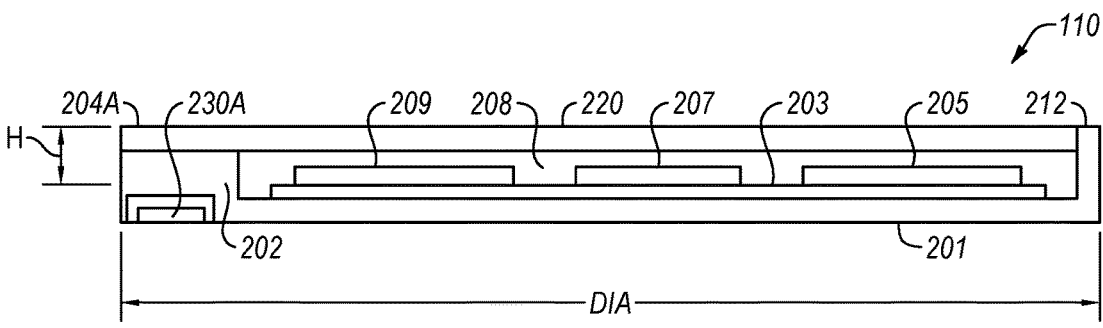
FIG. 2C illustrates a side, cross-section view of a diagnostic disc according to some embodiments of the disclosure.
Figure 2D:
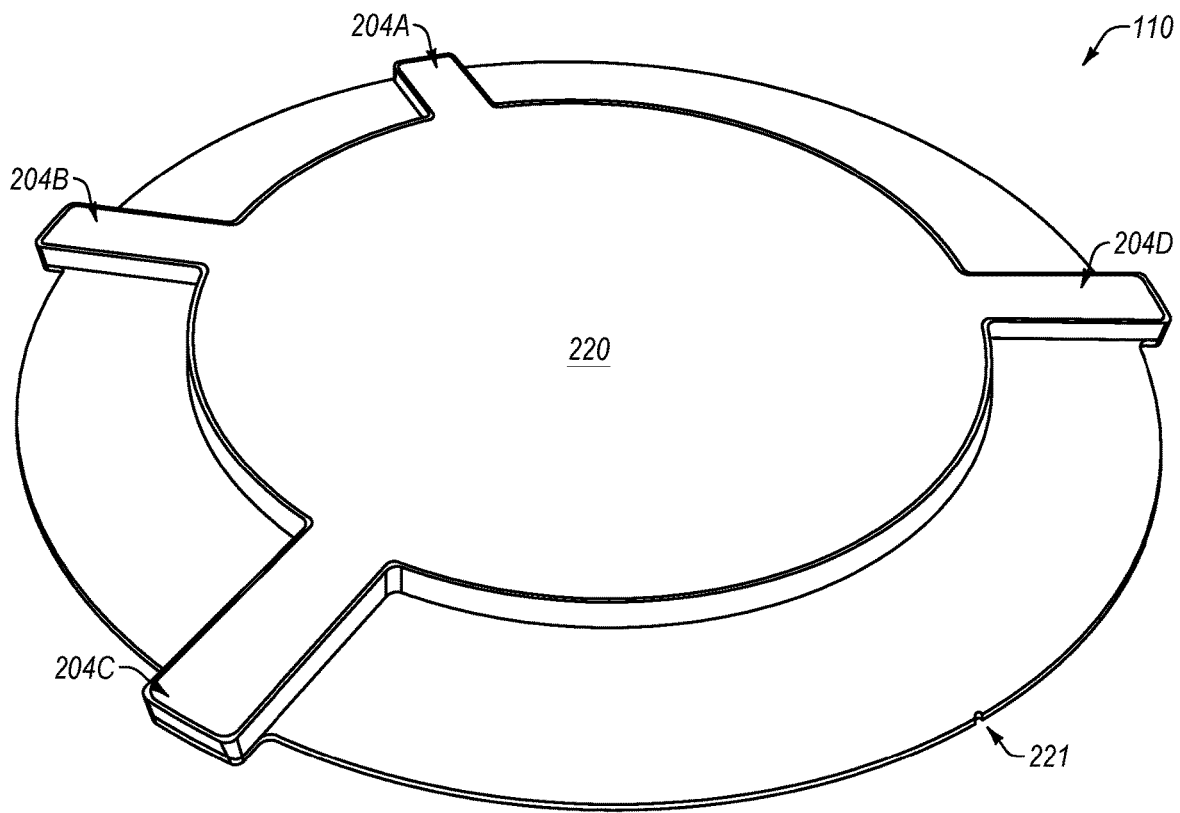
FIG. 2D illustrates a perspective top view of a shielded diagnostic disc according to embodiments of the disclosure.

FIG. 2C illustrates a side, cross-section view of the diagnostic disc 110 of FIG. 2A along the line "2A" according to some aspects of the disclosure. FIG. 2D illustrates a perspective top view of a shielded diagnostic disc according to embodiments of the disclosure.

With additional reference to FIG. 2A, a diameter (DIA) of the diagnostic disc 110 may be defined by two points on the outer perimeter of disc-shaped body 210, the two points being spaced apart from each other by 180°. One of the points defining the diameter DIA may be an edge of at least one protrusion. For instance, diameter DIA of disc-shaped body 210 (and of diagnostic disc 110) may be from an edge of the first protrusion 204A to point 212 (which may be a notch) on the outer perimeter of the disc-shaped body 210. In a similar manner, the diameter of the diagnostic disc may be from an edge of one of the second protrusion 204B, the third protrusion 204C, or a fourth protrusion 204D to a corresponding point on the perimeter of disc shaped body 210 that is located 180° C. from the corresponding edge of one of the protrusions. The diameter may range from about 310 mm to about 320 mm, or within 10-15 percent of about 310 mm to about 320 mm in some embodiments. The diameter should not be construed as limiting. In some embodiments, the diameter may range from any of about 310 mm, about 315 mm, about 320 mm, about 325 mm, about 330 mm, about 335 mm, about 340 mm, about 345 mm, or about 350 mm to any of about 355 mm, about 360 mm, about 365 mm, about 370 mm, about 375 mm, about 380 mm, about 385 mm, about 390 mm, about 395 mm, or about 400 mm, or any sub-range or single value therein.

Further, in certain embodiments, each non-contact sensor may be positioned such that a gap is formed between the non-contact sensor and the bottom of the disc-shaped body 210. For example, each non-contact sensor may be positioned on the underside of a respective protrusion such that a vertical distance between the non-contact sensor and a bottom of the disc-shaped body 210 displaces the non-contact sensor from a surface that the diagnostic disc is placed upon. The height of the diagnostic disc 110 may be defined by the height (H) of the raised walls 202, which may be up to about 15 mm, up to about 14 mm, up to about 13 mm, up to about 12 mm, up to about 11 mm, up to about 10 mm, up to about 9 mm, up to about 8 mm, up to about 7 mm, or up to about 6 mm.

In varying embodiments, the disc-shaped body 210, including the raised walls 202, and the cover 220 may be made of at least one of polyether ether ketone (PEEK), aluminum alloy, carbon fiber, or aluminum. In certain embodiments, the disc-shaped body and/or the cover are coated. In embodiments, the coating is configured to make the diagnostic disc 110 at least one of: vacuum resistant, high temperature resistant, scratch resistant, or a combination thereof. In an embodiment, the coating is reflective and/or transparent in order to counteract any infrared radiation that the diagnostic disc 110 may be exposed to. For instance, in one embodiment the coating is infrared transparent allowing the surface finish of the coating to reflect infrared radiation it may be exposed to. Reflecting away the infrared radiation and not absorbing it (or minimizing its absorption) could minimize the heat that gets transferred to the diagnostic disc. In some embodiments, the coating is highly polished. In certain embodiments, the coating has a surface roughness finish ranging from about 2 μin to about 20 μin, from about 4 μin to about 16 μin, from about 6 μin to about 12 μin, or any sub-range or single value therein.

In certain embodiments, the coating includes materials that can operate at a temperature of at least 50° C. while maintaining its integrity without flaking so as to avoid introduction of particle contaminants in the processing chamber. The coating may be corrosion and/or erosion resistant. Exemplary coating materials that may be used to coat the disc-shaped body 210 and cover 220 include, without limitations, at least one of anodized alumina, an aluminum alloy, or yttria.

In some embodiments, the diagnostic disc 110 further includes a plurality of kinematic coupling interfaces 235 disposed on a bottom surface of the disc-shaped body 210. The plurality of kinematic coupling interfaces 235 may be configured to engage with registration features of a substrate support assembly in a processing chamber (such as substrate support assembly 180 in processing chamber 107 in FIG. 1B). Engagement of the plurality of kinematic coupling interfaces 235 with the registration features causes the diagnostic disc 110 to achieve a target position and a target orientation in the processing chamber 107.

For example, the plurality of kinematic coupling interfaces 235 may be configured as sloped holes or slots to receive (or engage) wafer lift pins (253 in FIG. 2F) of an electrostatic chuck (ESC) 150 located within a processing chamber 107. FIG. 2E illustrates a side, cross-section view of an example of a plurality of kinematic couplings 235 in the diagnostic disc 110 of FIG. 2A. Kinematic couplings are fixtures designed to exactly constrain a part (e.g., the wafer lift pins) by providing precision and certainty of location. The plurality of kinematic couplings 235 may thus center the diagnostic disc 110 over or under a component so that the non-contact sensors are generally oriented in the direction of the component being imaged or scanned.

FIG. 2F illustrates a wafer lift pin 253 setting the diagnostic disc 110 down on the ESC 150 and a low contact area (LCA) 250 between the plurality of kinematic couplings 235 and the ESC 150 according to one embodiment of the disclosure. As illustrated, in one embodiment, the plurality of kinematic couplings 235 may provide a draft angle for easy lift engagement by the lift pins 253. In various embodiments, the kinematic couplings are made of one of copper, stainless steel, cirlex, vaspel, carbon fiber, rexolite, or polyether ether ketone (PEEK). Because the kinematic couplings 235 are not metal and touch the surface of the ESC 150, the diagnostic disc 110 avoids scratching or damaging the ESC 150. The LCA 250 and material of the kinematic couplings 235 may also help reduce particle generation and contamination.

In various embodiments, the controller 109 (e.g., computing system) may receive signals from and send controls to the factory interface robot 111, the wafer transfer chamber robot 112, and/or each non-contact sensor. In this way, the controller 109 may initiate diagnostics in which, for example, a component in one of the processing chambers 107 has been under operation for a certain number of hours. The controller 109 may signal the factory interface robot 111 to pick up one of the diagnostic discs 110 from one of the substrate cassettes 102 and transfer the diagnostic disc 110 to, e.g., the station 104b, which may be a load lock or a degas chamber, for example. Thereafter, the transfer chamber robot 112 may pick up, e.g., with an end effector of a robot arm, the diagnostic disc 110 and place the diagnostic disc 110 in the processing chamber 107 where it may acquire sensor data of a component. The sensor data may be transmitted wirelessly, e.g., using the wireless communication circuit, to the controller 109 via the WAP device 129.

FIG. 2G illustrates a schematic depicting positions of four non-contact sensors on a diagnostic disc according to embodiments of the disclosure. In the depicted embodiment, the disc-shaped body 210 includes a notch at a first position 221 on the circumference of the disc-shaped body. First position 221 may be referred to as the starting angle of 0°. The notch may be used with a pre-aligner so that the diagnostic disc 110 may be placed in a selected location in processing chamber 107 and/or may be picked up by an end effector.

In the depicted embodiment, a first non-contact sensor 230A may be attached to a first protrusion 204A that is positioned at an angle of about 170°-180° from the first position of the notch. In the depicted embodiment, a second non-contact sensor 230B may be attached to a second protrusion 204B that is positioned at an angle of about 225°-235° from the first position of the notch. In the depicted embodiment, a third non-contact sensor 230C may be attached to a third protrusion 204C that is positioned at an angle of about 295°-305° from the first position of the notch. In the depicted embodiment, a fourth non-contact sensor 230D may be attached to a fourth protrusion 204D that is positioned at an angle of about 55°-65° from the first position of the notch.

The first non-contact sensor 230A may be attached to the first protrusion 204A at about 295 mm to about 305 mm from an outer perimeter of the disc-shaped body 210. The second non-contact sensor 230B, the third non-contact sensor 230C, and the fourth non-contact sensor 230D attached to the second protrusion 204B, the third protrusion 204C, and the fourth protrusion 204D, respectively, may be positioned at about 310 mm to about 320 mm from the outer perimeter of the disc-shaped body 210.

The positions of the second protrusion 204B, third protrusion 204C, and fourth protrusion 204D and the corresponding second non-contact sensor 230B, third non-contact sensor 230C, and fourth non-contact sensor 230D, as described with respect to FIG. 2G, should not be construed as limiting as their positions could vary depending on the processing chamber used, the main frame robot used, the transfer chamber robot used, the end effectors of the robots, and so on. The at least one protrusion and the non-contact sensors attached thereto may be arranged in other angles or at other location so long as the non-contact sensors have clearance (e.g., past the end effector) to see the component or the area within the processing chamber that is being diagnosed.

In the embodiment depicted in FIGS. 2A, 2B, 2C, 2D, 2G, and 7B, the first non-contact sensor 230A (e.g., first camera) is positioned so that it is centered on an edge of a flat region 222 (also 800 in FIG. 7A) and a beginning of the circular edge of ESC 150. The second non-contact sensor 230B (e.g., second camera), third non-contact sensor 230C (e.g., third camera), and fourth non-contact sensor 230D (e.g., fourth camera) in the depicted embodiment are positioned to view the ring section of the process kit (e.g., edge ring 90 and support ring 390). The positioning of non-contact sensors 230A, 230B, 230C, and 230D in the depicted embodiment allow measurement of the gap between the ESC 150 and the process kit ring to determine alignment and concentricity of the process kit ring according to an embodiment described in further detail below with respect to FIGS. 7A-7B.

In embodiments, diagnostic disc 110 may be transferred within a wafer processing system in a same manner as wafers do using the same robots. As such the diagnostic disc may have certain attributes that make it possible for it to move through the wafer processing, such as certain target dimensions (e.g., height and width), target weight, target center of mass, and so on. The height and width may have the dimensions described hereinabove with respect to DIA and H of FIG. 2C. In certain embodiments, the mass of the diagnostic disc 110 may range from about 500 g to about 700 g, from about 530 g to about 650 g, or from about 550 g to about 600 g. In certain embodiments, the center of mass of the diagnostic disc 110 may be about 0.05 to about 0.15, about –0.15 to about 0.0, about 0.0 to about 0.15 (X,Y,Z) from diametral center. In certain embodiments, the center of mass of the diagnostic disc 110 may be about 0.10 to about 0.13, about –0.10 to about –0.05, about 0.05 to about 0.10 (X,Y,Z) from diametral center.

The various components within the internal cavity 208 of the diagnostic disc 110, such as at least the PCB 203, circuitry 205, and wireless charger 209 may all be made of a glass reinforced epoxy laminate material (e.g., FR-4) and copper. In certain embodiments, the PCB 203 may weigh from about 40 g to about 70 g, from about 45 g to about 65 g, or from about 50 g to about 60 g. In certain embodiments, the wireless charger 209 may weight from about 5 g to about 20 g, from about 8 g to about 17 g, or from about 10 g to about 15 g. In certain embodiments, the circuitry 205 may weight from about 10 g to about 20 g, from about 12 g to about 18 g, or from about 14 g to about 16 g.

Any of the diagnostic discs described herein may be transferred into a processing chamber (such as processing chamber 107) to generate sensor data in-situ, without venting the processing chamber. As such, the diagnostic disc 110 may be exposed to high vacuum and/or high temperature and/or corrosive environment. Existing power sources, such as lithium batteries, may leak, expand, or even explode under vacuum and/or high temperature environment.

In embodiments, the instant disclosure is directed to a power source coupled to a PCB having a power management circuitry disposed thereon to form a power unit. In embodiments, the power unit is configured to operate at high vacuum and high temperature without deforming (e.g., not swelling), rupturing, or exploding. High vacuum may encompass a pressure of up to about 50 mTorr (e.g., from about 0.1 mTorr to about 50 mTorr, from about 15 mTorr to about 50 mTorr, or from about 30 mTorr to about 50 mTorr). High temperature may encompass a temperature of about 50° C. to about 120° C., about 65° C. to about 120° C., about 80° C. to about 120° C., about 50° C. to about 80° C., or about 65° C. to about 80° C. In certain embodiments, the power source can operate at temperatures ranging from about −20° C. to about 120° C., from about 0° C. to about 120° C., from about 20° C. to about 120° C., from about 50° C. to about 85° C., or any single value or sub-range therein.

Figure 3A:
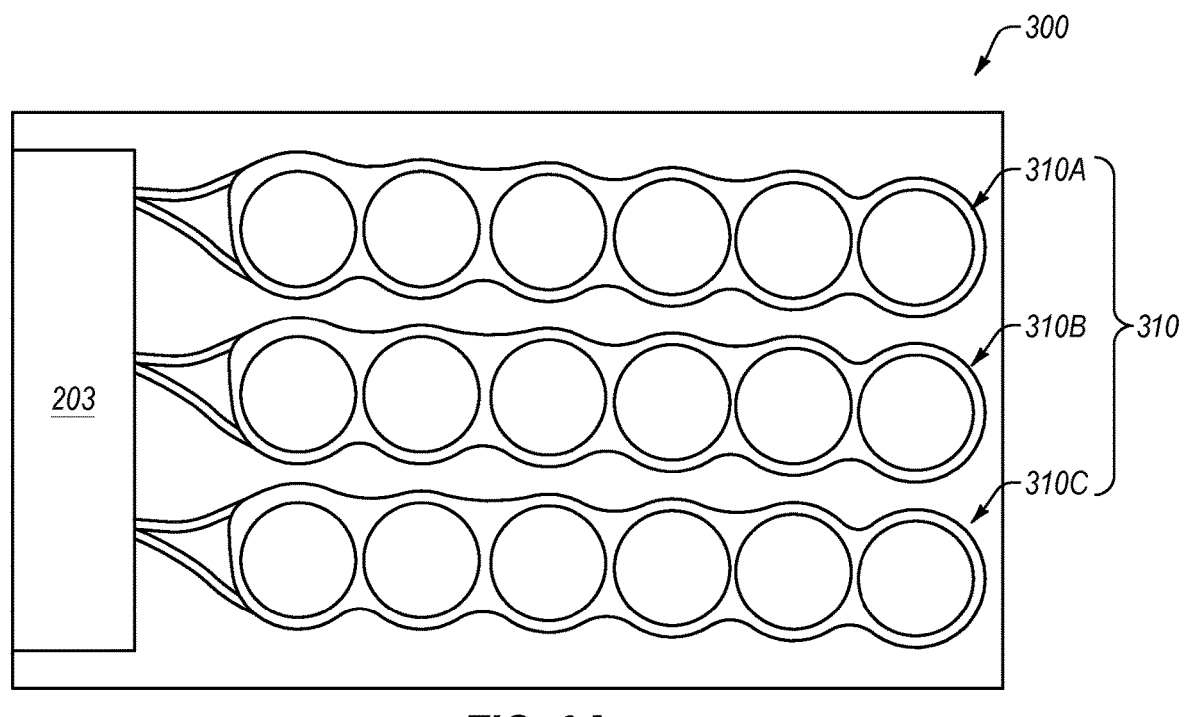
FIG. 3A illustrates a top view of a power source according to embodiments of the disclosure.

FIG. 3A illustrates a top view of a power unit, according to embodiments of the disclosure, that may be used in a diagnostic disc 110. The power unit 300 includes a PCB 203 and an ultra-capacitor 310 (e.g., the combination of 310A, 310B, and 310C in the embodiment depicted in FIG. 3A) comprising a plurality of capacitors connected in parallel and in series. In the depicted embodiment in FIG. 3A, three groups 310A, 310B, and 310C of six capacitors are connected in series and the three groups (310A, 310B, and 310C) are connected in parallel. The arrangement depicted in FIG. 3A should not be construed as limiting. It should be understood by the skilled artisan that a different number of capacitors may be arranged in various arrangements in parallel, in series, and in a combination thereof so as to arrive at a target power attributes.

The ultra-capacitor 310 may be coupled to the PCB 203 in certain embodiments. Alternatively, the ultra-capacitor 310 may be an integral part of PCB 203. For instance, FIG. 3B illustrates a perspective top view of a power unit, according to other embodiments of the disclosure, that may be used in a diagnostic disc 110, of an ultra-capacitor 320 being an integral part of PCB 203. PCB 203 may in the embodiment depicted in FIG. 3B is a two layer PCB. Ultra-capacitor 320 formed on two layer PCB 203 of the embodiment depicted in FIG. 3B, includes eight groups (four on each side of the PCB with only one side shown in FIG. 3B of four groups 320A, 320B, 320C, 320D) which are connected in parallel and each group includes six capacitors connected in series.

In certain embodiments, regardless of the arrangement of the ultra-capacitor (e.g., 310 or 320 or another arrangement not shown) and the PCB 203, the power unit 300 may further include a hermetically sealed casing so that if the power source does fail at high vacuum and/or high temperature conditions, the materials of the power source remain contained and do not contaminate the diagnostic disc 110 or the processing chamber 107. The casing for the power unit also provides vacuum protection and/or electrical isolation to the power unit.

In the embodiment depicted in FIG. 3A, the ultra-capacitor 310 is encapsulated in a hermetically sealed casing made of silicon. In certain embodiments, the casing may be made of metal. The hermetically sealed casing may conformally coat power source or the entire power unit (e.g., at least the power source together with the PCB). A hermetic seal may be formed on the power source or on the entire power unit by placing the power source or the power unit in a form (e.g., a mold) and flooding the form with the casing material (e.g., silicon). Other method for hermetically sealing the power source or the entire power unit may also be suitably used.

In the depicted embodiment in FIG. 3A, the plurality of capacitors include sodium chloride. In certain embodiments, sodium chloride is advantageously more stable at high vacuum and high temperature environments as compared to certain materials that are currently used in power sources, such as lithium. Lithium is a self-oxidizer and in high temperature and high vacuum environments, it may ignite, produce its own oxygen, and burst. Lithium is also a heavy metal which cannot be cleaned from a diagnostic disc or from a processing chamber if it were to contaminate any one of those. In contrast, if an ultra-capacitor containing sodium chloride fails and ruptures at the high temperature and high vacuum environment of a processing chamber, the sodium can be readily cleaned. In certain embodiments, the power source is free of heavy metals. In one embodiment, the power source is free of Lithium. In one embodiment, the power source is free of copper.

In certain embodiments, the power source may include lithium so long as the power unit is configured to operate at a high vacuum and a high temperature without bursting or exploding and optionally without deforming.

In various embodiments, the power source may have a low profile, e.g., a height of up to about 6 mm, up to about 5.5 mm, or up to about 5 mm, so it could fit within the interior formed by the disc-shaped body and the cover, be shielded within that interior, and separated from an environment outside of the disc-shaped body. In an embodiment, the power source may have a width ranging from about 45 mm to about 50 mm, from about 46 mm to about 49 mm, or from about 47 mm to about 48 mm and a length ranging from about 50 mm to about 200 mm, from about 65 mm to about 185 mm, or from about 80 mm to about 170 mm. In an embodiment, the weight of the power source may range from about 40 g to about 60 g, from about 45 g to about 55 g, or from about 48 g to about 52 g. In certain embodiments, these dimensions refer to the ultra-capacitor by itself without the PCB. In other embodiments, these dimensions refer to the ultra-capacitor along with the PCB.

Figure 3B:
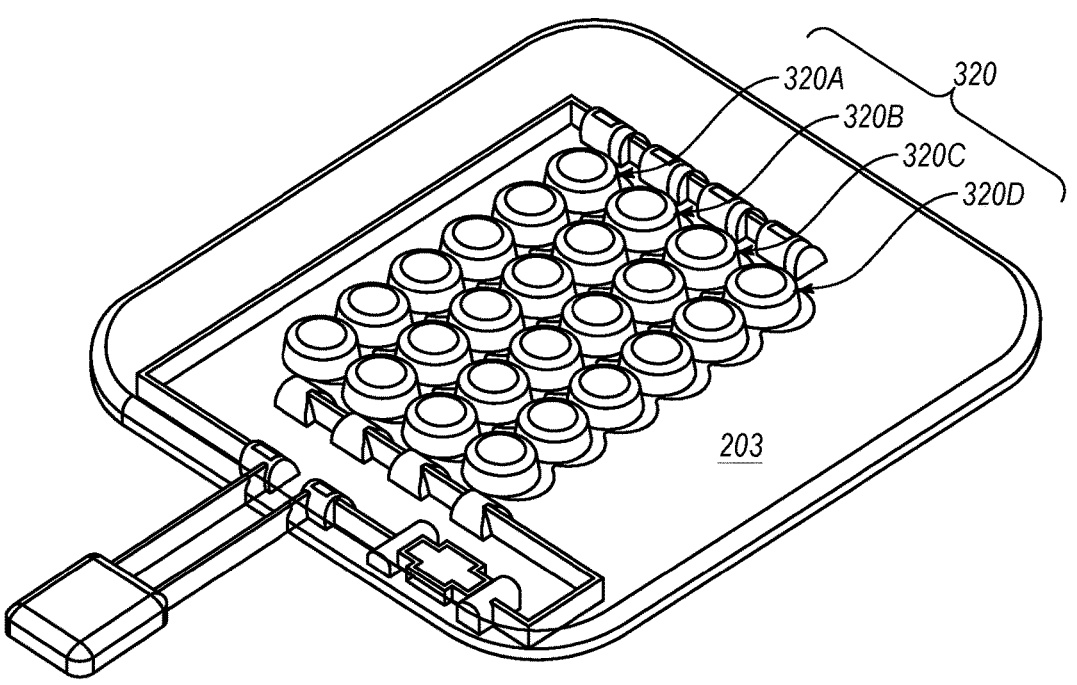
FIG. 3B illustrates a perspective top view of a power source according to embodiments of the disclosure.

In certain embodiments, a single string (e.g., each string of six capacitors in series such as 310A or 320A in FIGS. 3A and 3B respectively) of an ultra-capacitor may have some target attributes. For example, a single string of an ultra-capacitor may have one or more of the following: an output voltage of about 8.4 V, a capacitance of about 15 F, a height of about 2 mm to about 3 mm, a width of about 12 mm to about 16 mm, a length of about 70 mm to about 75 mm, a mass of about 8 g to about 10 g, a minimum storage energy of about 105 Ws, an operational temperature range of about −20° C. to about 120° C., an equivalent series resistance (ESR) of about 15 Ohms, a leakage current in 24 hours of about 0.10 to about 0.15 mA, a maximum charge current of about 50 mA, a maximum discharge current of about 70 mA, and a lowest discharge voltage of about 4.8 V.

In one embodiment, the power source may include a keying feature (such as a mechanical feature on the PCB or an etch connector with a key) to ensure that the power source is correctly placed.

In various embodiments, the power source may be charged using a charging circuit on the PCB that limits the voltages at the top and bottom ends and protects the power source from over-charging or under-charging. The power source may be charged at atmospheric pressure and at room temperature (e.g., about 20° C. to about 30° C.) or at vacuum. In certain embodiments, the power source may be charged wirelessly by placing the diagnostic disc next to a charging block or a charging pad. In certain embodiments, the diagnostic disc 110 may include a charging location identifier for wireless charging thereon. Alternatively, the power source may be charged using a USB cable.

A plurality of diagnostic discs 110 may rotate when conducting diagnostic scans so that when the power source of a first diagnostic disc is being charged, a second diagnostic disc performs a diagnostic scan. Subsequently the two diagnostic discs may switch places such that the power source of the second diagnostic disc may charge while the first diagnostic disc performs a diagnostic scan.

In certain embodiments, the power source has a charge time to run time ratio of about 1:2 to about 3:2, or about 1:1. A charge time to run time ratio of 1:1, as used herein, means that charging the power source for about 30 minutes would be sufficient to power the diagnostic disc 110 for about 30 minutes. A charge time to run time ratio of 1:2, as used herein, means that charging the power source for about 30 minutes would be sufficient to power the diagnostic disc 110 for about 60 minutes. A charge time to run time ratio of 3:2, as used herein, means that charging the power source for about 30 minutes would be sufficient to power the diagnostic disc 110 for about 20 minutes. In certain embodiments, the power source is sufficient to power the diagnostic disc and the operations of the diagnostic disc (e.g., image capturing) for a run time of about 15 minutes to about 60 minutes, about 20 minutes to about 50 minutes, or about 25 minutes to about 45 minutes.

The charge time to run time ratios enumerated herein should not be construed as limiting. In certain embodiments, the charge time to run time ratio may range from any of about 1:100, about 1:75, about 1:50, about 1:25, about 1:10, about 1:10, about 1:5, or about 1:1 to any of about 5:1, about 10:1, about 15:1, about 25:1, about 50:1, about 75:1, or about 100:1, or any sub-range or single value therein.

In certain embodiments, the power source has a voltage output of about 3.7V and a current usage ranging from about 300 mA to about 1200 mA, from about 350 mA to about 800 mA, or about 400 mA to about 600 mA. In certain embodiments, the power source has a current capacity ranging from about 400 mAh to about 600 mAh, from about 450 mAh to about 650 mAh, or from about 480 mAh to about 620 mAh.

In certain embodiments, the power source is durable and has a life time of at least about 350 cycles, at least about 400 cycles, at least about 450 cycles, or at least about 500 cycles at 1° C. The term "life time" refers to the number of cycles that the power source may be utilized until it has about 80% capacity remaining, where a single cycle refers to the power source being charged, the power source powering a diagnostic scan using any of the diagnostic discs described herein, and the power source being discharged. In one embodiment, a diagnostic scan within a single cycle may include a plurality of multi-minute measurements during which sensor data gets generated (e.g., twelve three minute measurements or four measurements of eight photo captures in each measurement).

The power sources described herein may be non-toxic and safe to travel unregulated in an aircraft without special classifications similar to what is found in conventional lithium batteries. As such, the power sources described herein may comply with safety regulations UL 2054, IEC 62133 ed. 2, and UN 38.3.

A suitable power source may have certain target attributes (such as, without limitations, voltage output, current usage, energy density, equivalent series resistance, mass, and so on) to form a power unit that enables usage of the diagnostic disc 110 for a target duration and at the high temperature and high vacuum conditions without deforming, exploding, rupturing, or contaminating the processing chamber. Exemplary attributes for a power source according to an embodiment are outlined in Table 2 below.

TABLE 2

| Exemplary Attributes of a Power Source According to an Embodiment | |
| --- | --- |
| Attribute | Value |
| Width | 47.5 mm |
| Length | 84.5 mm |
| Height | 6.0 mm |
| Mass | 40-60 grams (e.g., 50 grams) |
| Current Capacity | 500 mAh |
| Voltage Range | 3.7V nominal |
| Peak Load | 1200 mA |
| Nominal Load | 350 mA - 850 mA |
| Temp | 120° C. |
| Vacuum spec | 0.1 mTorr |
| Run Time | 30 min |
| Energy Density | 9 Ws/g to 13 Ws/g |
| Equivalent Series Resistivity (ESR) | Up to about 1.5 ohm |

Although the power source described herein with respect to FIGS. 3A and 3B is being depicted with a diagnostic disc, the skilled artisan would appreciate that a similar power source may be utilized to power other devices in the wafer processing system 100 or in a processing chamber 107. These power sources are particularly advantageous since they get away from powering wafer processing system components via wires. The power sources described herein are also advantageous due to their low cost, improved performance, low toxicity, durability under high/low temperature/vacuum conditions and corrosive environments, high cycle life, scalability, beneficial charge time to run time ratio, and ease of transportation via an aircraft.

Figure 4:
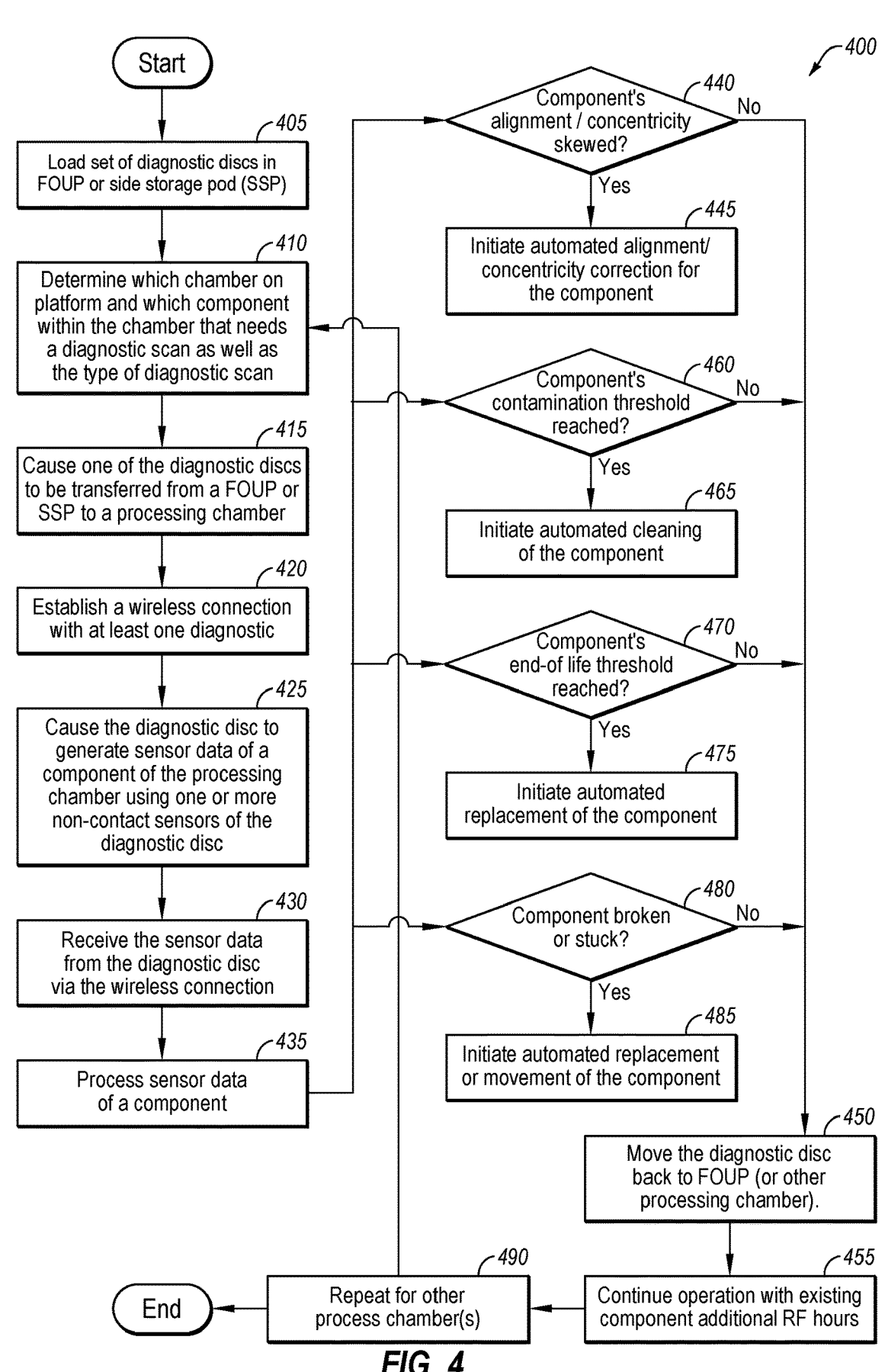
FIG. 4 is a flow chart of an operational method of a diagnostic disc according embodiments of the disclosure.

FIG. 4 is a flow chart of a method 400 for using a diagnostic disc for obtaining sensor data of a component within a processing chamber, such as processing chamber 107 of FIG. 1B, according to various embodiments of the disclosure. Some operations of method 400 may be performed by processing logic that may include hardware (circuitry, dedicated logic, etc.), software (such as is run on a general purpose computer system or a dedicated machine), firmware, or some combination thereof. Some operations of method 400 may be performed by a computing device, such as the controller 109 of FIG. 1A, that is in control of a robot arm and/or a non-contact sensor. For example, processing logic that performs one or more operations of method 400 may execute on the controller 109.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

With reference to FIG. 4, the method 400 may begin with the processing logic loading one or a set of diagnostic discs 110 within one of the substrate cassettes 102 (such as a FOUP or SSP) (405). In one embodiment, one or more diagnostic disc is stored in a FOUP that also contains edge rings, or more generally, a process kit ring. In one embodiment, multiple diagnostic discs are stored in a FOUP designed to house diagnostic discs. The method 400 may continue with the processing logic determining that a certain component in a processing chamber 107 is due for a diagnostic scan based on a number of RF hours of operation of the processing chamber within a substrate processing system (410) and/or based on other criteria (e.g., an amount of time that has passed since a last analysis was performed of the component in a processing chamber). The processing logic may also determine the type of diagnostic scan for the component (i.e., the type of sensor data to be generated, such as, metrology data, gap measurement, and so on) (410).

The method 400 may continue with the processing logic causing one of the diagnostic discs 110 to be transferred from the FOUP (or SSP) to the processing chamber with similar movement as used to move a wafer (415). In embodiments, this includes causing a robot arm within a factory interface area (such as 91 in FIG. 1A) to move a diagnostic disc 110 from a wafer storage area and load the diagnostic disc into a load lock of the substrate processing system (e.g., by the factory interface robot 111). In embodiments, this may further include causing a robot arm within the transfer chamber area (such as 106 in FIG. 1A) to retrieve the diagnostic disc 110 from the load lock to a processing chamber (e.g., by the transfer chamber robot 112). This may include causing the an end effector of a robot arm within transfer chamber 106 to pick up and place a diagnostic disc 110 into a processing chamber 107 with similar movement as used to move a wafer.

The method 400 may optionally continue with processing logic causing a transfer chamber robot 112 to transfer the diagnostic disc 110 from the end effector of the robot arm to the wafer lift pins 253 of the ESC 150 (FIG. 2F). In one embodiment, the method 400 may further include causing a plurality of wafer lift pins of a substrate support assembly in a processing chamber to raise so that the plurality of kinematic coupling interfaces (e.g., 235 in FIG. 2E) of the diagnostic disc 110 engage with the plurality of wafer lift pins to cause the diagnostic disc 110 to have a target position and a target orientation. In one embodiment, the method 400 may further include causing the plurality of wafer lift pins of the substrate support assembly in a processing chamber to lower, e.g., to set the diagnostic disc 110 on the ESC (420).

The method 400 may continue with the processing logic establishing a wireless connection with at least one of the diagnostic discs 110 (420). The wireless connection may be a secure wireless connection. The wireless connection may be established before the diagnostic disc 110 is placed in a processing chamber or after the diagnostic disc 110 is placed in a processing chamber. Upon establishing a wireless connection, the method 400 may continue with the processing logic loading a script onto the diagnostic disc 110, which script causes the diagnostic disc 110 to monitor temperature, control illumination, and generate sensor data in accordance with a diagnostic scan algorithm.

The method 400 may further include the processing logic causing the diagnostic disc 110 to generate sensor data of a component of the processing chamber using one or more non-contact sensors of the diagnostic disc (425). For instance, causing the diagnostic disc 110 to generate sensor data may include causing the non-contact sensors of the diagnostic disc to generate sensor data depicting a plurality of multi-minute measurements. In one embodiment, causing cameras on the diagnostic disc 110 to generate sensor data may include causing the camera to auto focus, illuminate, and take a first image of a portion of a component, followed by causing the camera to auto focus, illuminate, and take a second image of the portion of the component, followed by causing the camera to auto focus, illuminate and take a third image of the portion of the component.

The method 400 may further include receiving the sensor data from the diagnostic disc via the wireless connection (430). The sensor data may be received while the diagnostic disc 110 is disposed on a blade of a robot arm and within a processing chamber, when the diagnostic disc is on the wafer lift pins 253, or after the diagnostic disc 110 has been lowered to the ESC 150.

With additional reference to FIG. 4, in various embodiments, the method 400 further includes the processing logic analyzing the sensor data to determine at least one of: alignment, concentricity, a degree of cleanliness, a degree of erosion of a component, whether a component is broken, whether a component is stuck (435).

If method 400 determines alignment or concentricity (440) and the processing logic determines that the alignment or the concentricity is not skewed, the method 400 may continue with the processing logic causing the transfer chamber robot to move the diagnostic disc 110 from the processing chamber back to the load lock. The method 400 may further continue with the processing logic determining that additional maintenance is not required and causing the factory interface robot to move the diagnostic disc 110 from the load lock and back to the storage area (e.g., the FOUP or SSP) (450). The method 400 may further continue with the processing logic causing the substrate processing to continue for an additional number of RF hours before again initiating a diagnostic scan of the component (455).

If, however, the alignment or concentricity of the component is skewed, the method 400 may continue with the processing logic initiating automated correction of the alignment or concentricity of the component (445).

If method 400 determines a degree of cleanliness (460) and the processing logic determines that the degree of cleanliness does not meet a contamination threshold, the method 400 may continue with the processing logic causing the transfer chamber robot to move the diagnostic disc 110 from the processing chamber back to the load lock. The method 400 may further continue with the processing logic determining that additional maintenance is not required and causing the factory interface robot to move the diagnostic disc 110 from the load lock and back to the storage area (e.g., the FOUP or SSP) (450). The method 400 may further continue with the processing logic causing the substrate processing to continue for an additional number of RF hours before again initiating a diagnostic scan of the component to determine a degree of cleanliness (455).

If, however, the degree of cleanliness of the component meets a contamination threshold, the method 400 may continue with the processing logic initiating automated cleaning of the component (465).

If method 400 determines a degree of erosion (470) and the processing logic determines that the degree of erosion does not meet an end-of-life threshold, the method 400 may continue with the processing logic causing the transfer chamber robot to move the diagnostic disc 110 from the processing chamber back to the load lock. The method 400 may further continue with the processing logic determining that additional maintenance is not required and causing the factory interface robot to move the diagnostic disc 110 from the load lock and back to the storage area (e.g., the FOUP or SSP) (450). The method 400 may further continue with the processing logic causing the substrate processing to continue for an additional number of RF hours before again initiating a diagnostic scan of the component to determine a degree of erosion (455).

If, however, the degree of erosion of the component meets an end-of-life threshold, the method 400 may continue with the processing logic initiating automated replacement of the component (475). Replacement of a component may include removal of the worn component (e.g., a process kit ring) from the processing chamber back to the storage area (e.g., the FOUP or SSP). Replacement of the component may further optionally include purging, using a pressurized gas source (e.g., nitrogen) of the processing chamber, residue, and particles surrounding the worn component. Replacement of the component may further include moving a new component from the storage area into the processing chamber as a replacement for the worn component. Replacement of the component may further include placing the new component into the processing chamber using a robot blade.

If method 400 identifies a broken or a stuck component (480) and the processing logic determines that the component is not broken or is not stuck, the method 400 may continue with the processing logic causing the transfer chamber robot to move the diagnostic disc 110 from the processing chamber back to the load lock. The method 400 may further continue with the processing logic determining that additional maintenance is not required and causing the factory interface robot to move the diagnostic disc 110 from the load lock and back to the storage area (e.g., the FOUP or SSP) (450). The method 400 may further continue with the processing logic causing the substrate processing to continue for an additional number of RF hours before again initiating a diagnostic scan of the component to identify a broken or a stuck component (455).

If, however, the component is broken, the method 400 may continue with the processing logic initiating automated replacement of the component similar to the replacement of a worn out component as described above (485). If the component is stuck, the method 400 may continue with the processing logic initiating automated movement of the component (485).

The functionality of method 400 may be repeated for additional components in additional processing chambers (490). The functionality of method 400 may also be repeated to diagnose other issues associated with components in a processing chamber that may be diagnosed by any of the diagnostic discs described herein and/or that may be automatically addressed with a robot within a processing chamber, such as a transfer chamber robot 112.

In embodiments, the sensor data generated by the diagnostic disc may include image data. In embodiments, the processing logic analyzing the sensor data includes applying one of an image processing algorithm or a trained machine learning model to the sensor data that determines at least one of the following with respect to the diagnosed component: alignment, concentricity, degree of cleanliness, degree of erosion, whether the component is broken, whether the component is stuck, and the like.

Figure 5:
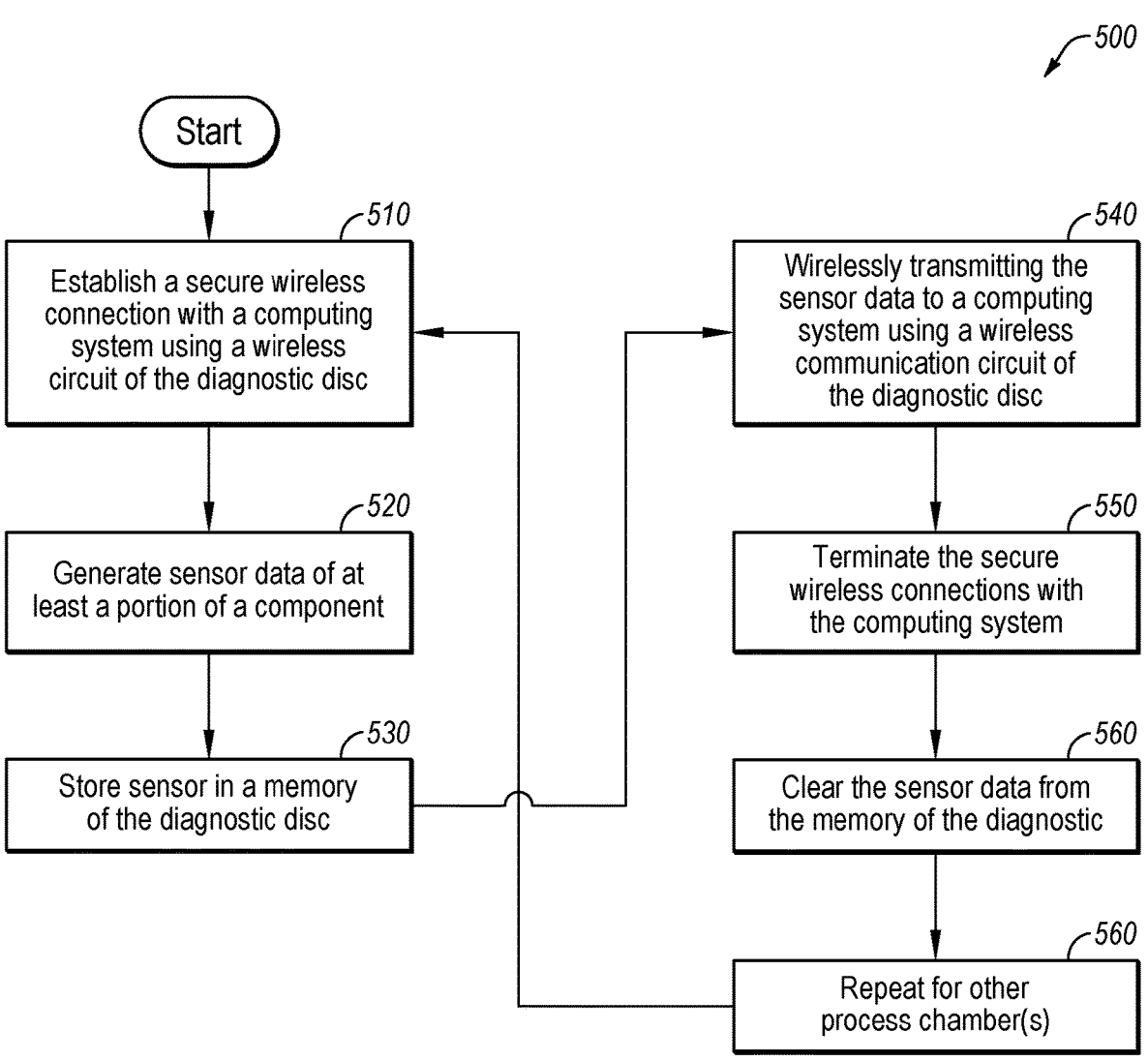
FIG. 5 is a flow chart of an operational method of a computing system according embodiments of the disclosure.

FIG. 5 is a flow chart of a method 500 for using an in-situ non-contact sensor (e.g., non-contact sensor 230) of a diagnostic disc for generating sensor data and wirelessly transmitting said sensor data to controller 109 (e.g., a computing system). Some operations of method 500 may be performed by processing logic that may include hardware (circuitry, dedicated logic, etc.), software (such as is run on a general purpose computer system or a dedicated machine), firmware, or some combination thereof. Some operations of method 500 may be performed by the diagnostic disc 110 before or after the diagnostic disc 110 is placed into a processing chamber.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

With reference to FIG. 5, the method 500 may begin with the diagnostic disc 110 establishing a secure wireless connection with a computing system using a wireless circuit of the diagnostic disc (510). The secure wireless connection between the diagnostic disc and the computing system may be established before or after the diagnostic disc enters the processing chamber (e.g., processing chamber 107 in FIG. 1A). The secure wireless connection between the diagnostic disc and the computing system may be established when the diagnostic disc is held by a robot arm of transfer robot 112, when it is placed on wafer pins 253, or when it is placed on an ESC 250.

The method 500 may continue with the diagnostic disc receiving a script from a computing system, through which the diagnostic disc 110 may be instructed to, e.g., monitor temperature, control illumination, and generate sensor data.

The method 500 may continue with at least one non-contact sensor (e.g., 230A, 230B, 230C, or 230D) of the diagnostic disc 110 generating sensor data of at least a portion of a component disposed within the processing chamber (e.g., processing chamber 107) (520). Generating the sensor data of at least a portion of the component may be performed at a similar pressure and temperature as is present in the processing chamber during wafer processing. For instance, sensor data may be generated in a processing chamber while at vacuum (e.g., about 0.1 mTorr to about 50 mTorr, about 15 mTorr to about 50 mTorr, or about 30 mTorr to about 50 mTorr) and/or at a temperature range of about −20° C. to about 120° C., about 0° C. to about 120° C., about 50° C. to about 85° C., about 50° C. to about 120° C., about 65° C. to about 120° C., about 80° C. to about 120° C., about 50° C. to about 80° C., or about 65° C. to about 80° C.

Generating sensor data may include the non-contact sensors of the diagnostic disc taking a plurality of multi-minute measurements. In one embodiment, cameras on the diagnostic disc 110 generate sensor data by auto focusing on a portion of a component (e.g., an edge ring, a process kit ring, or an ESC), illuminating, and taking a first image of a portion of the component, followed by auto focusing, illuminating, and taking a second image of the portion of the component, followed by auto focusing, illuminating and taking a third image of the portion of the component. In certain embodiments, diagnostic disc 110 may generate sensor data without auto focusing and/or without illuminating the portion of the component prior to taking an image.

The at least one non-contact sensor of diagnostic disc 110 may generate sensor data of various components within the processing chamber. Some exemplary components include, without limitations, a process kit ring, a single ring, a substrate support assembly, an electrostatic chuck (ESC), a chamber wall, a base, a gas line, a gas distribution plate, a face plate, a showerhead, a nozzle, a lid, a liner, a liner kit, a shield, a plasma screen, a remote plasma source, a flow equalizer, a cooling base, a chamber viewport, or a chamber lid.

Continuing with reference to FIG. 5, the method 500 may continue with storing the sensor data in a memory of the diagnostic disc (530). The method 500 may further continue with the wireless communication circuit of the diagnostic disc wirelessly transmitting the sensor data to a computing system (540). In certain embodiments, the diagnostic disc may only transmit sensor data to a computing system without storing it in the diagnostic disc's memory. The sensor data may comprise image data to be analyzed by a computing system to determine at least one of the following with respect to the component: alignment, concentricity, degree of cleanliness, degree of erosion, whether the component is broken, whether the component is stuck, and the like.

The method 500 may continue with terminating the secure wireless connection with the computing system (550). The method 500 may further continue with clearing the sensor data from the memory of the diagnostic disc (560). In certain embodiments, the diagnostic disc will also clear any script received from the computing system upon termination of the secure wireless connection with the computing system. In certain embodiments, the diagnostic disc will turn off its non-contact sensors and/or its illumination components upon termination of the secure wireless connection with the computing system.

The functionality of method 500 may be repeated for additional components in additional processing chambers (570). The functionality of method 500 may also be repeated to diagnose other issues associated with components in a processing chamber that may be diagnosed by any of the diagnostic discs described herein and/or that may be automatically addressed with a robot within a processing chamber, such as a transfer chamber robot 112.

EXAMPLES

The following examples are set forth to assist in understanding the disclosure and should not be construed as specifically limiting the disclosure described and claimed herein. Such variations of the disclosure, including the substitution of any or all equivalents now known or later developed, which would be within the purview of those skilled in the art, and minor changes in architecture, operation, design, or attributes, are to be considered to fall within the scope of the disclosure incorporated herein.

Figure 6A:
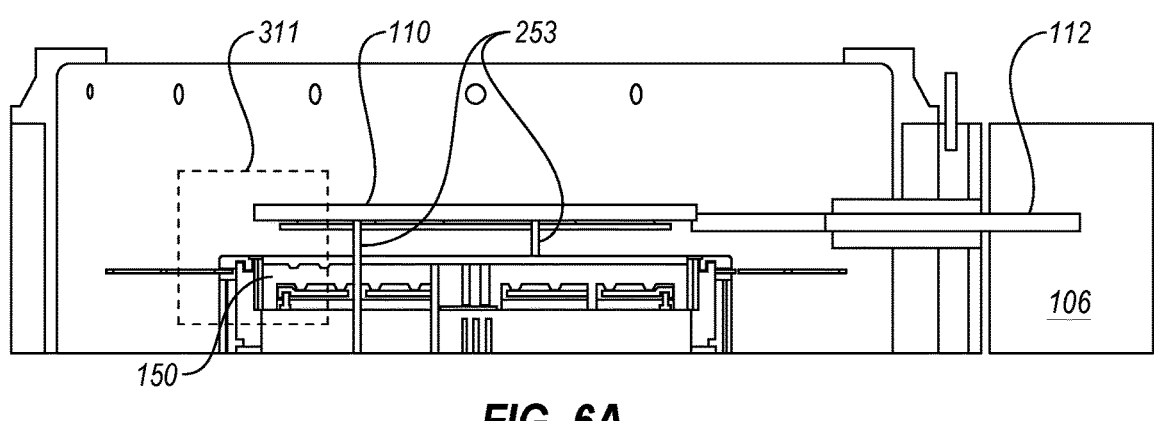
FIG. 6A illustrates a side, cross-section view of diagnostic disc being placed on wafer lift pins of an electrostatic chuck (ESC) of a processing chamber according to an exemplary embodiment of the disclosure.

Example 1—Diagnostic Scan to Determine Degree of Erosion of an Edge and Support Rings FIG. 6A illustrates a side, cross-section view of a diagnostic disc (e.g., 110) being placed on wafer lift pins (e.g., 253) of an ESC (e.g., 150) of a processing chamber (e.g., 107) according to an embodiment of the disclosure. The diagnostic disc is illustrated setting on top of an end effector (e.g., a robot blade) of the robot arm of the transfer chamber robot (e.g., 112) located within the transfer chamber (e.g., 106). An area 311 around the left portion of the ESC (e.g., 150) where a part of the edge ring resides has been encircled, which area 311 is enlarged in FIGS. 6B-6C.

Figure 6B:
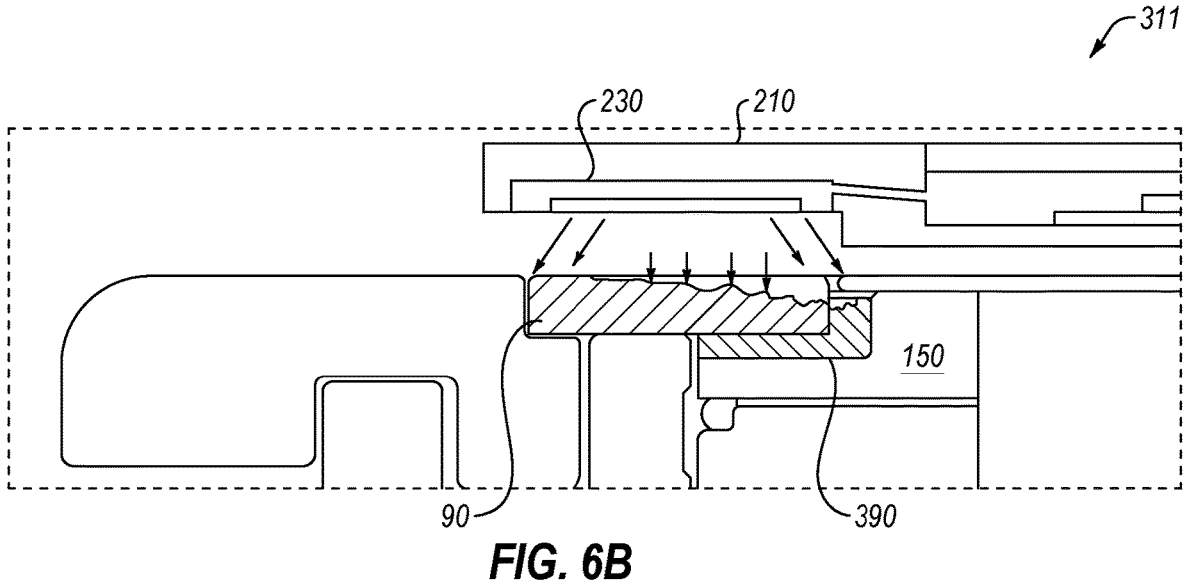
FIG. 6B is an exploded view of a portion of the diagnostic disc of FIG. 6A in which a high resolution camera captures sensor data of the edge and support rings according to an exemplary embodiment of the disclosure.

FIG. 6B is an exploded view of a portion of the diagnostic disc (e.g., 110) of FIG. 3 in which the non-contact sensor 230 is a high resolution camera that captures sensor data of the edge and support rings according to an exemplary embodiment of the disclosure. The wafer lift pins (e.g., 253) illustrated in FIG. 6A may be raised and the end effector of the robot arm of the transfer chamber robot (e.g., 112) may set the diagnostic disc (e.g., 110) down on the wafer lift pins (e.g., 253). The kinematic couplings (e.g., 235) on the diagnostic disc may ensure that the wafer lift pins are forced to center the diagnostic disc over the ESC (e.g., 150) such that each non-contact sensor 230 is positioned vertically on top of the edge ring 90. In one embodiment, the wafer lift pins (e.g., 253) are only slightly raised so that the non-contact sensor 230 leaves a smaller gap to the edge ring 90. While the diagnostic disc (e.g., 110) rests on the wafer lift pins (e.g., 253), the non-contact sensor 230 may generate sensor data indicative of the degree of erosion of the edge ring 90 and wirelessly communicate the sensor data to the controller (e.g., 109).

Figure 6C:
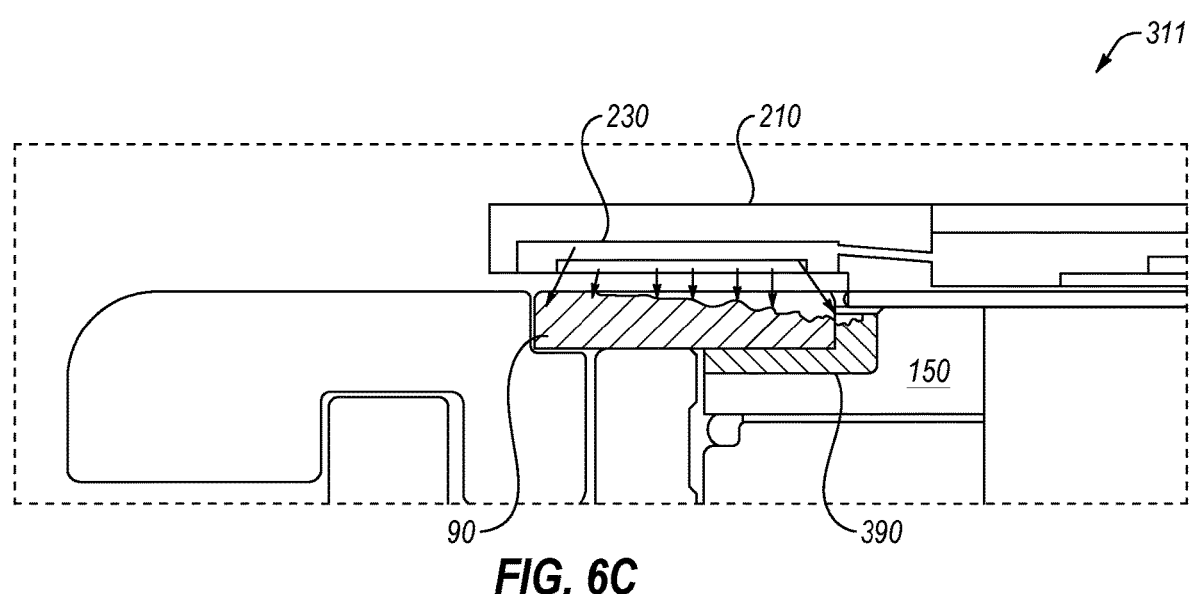
FIG. 6C is an exploded view of a portion of the diagnostic disc of FIG. 6A in which a non-contact sensor captures sensor data of the edge and support rings according to an exemplary of the disclosure.

FIG. 6C is an exploded view of a portion of the diagnostic disc (e.g., 110) of FIG. 6A in which each non-contact sensor 230 captures sensor data of the edge ring 90 and the support ring 390 according to an exemplary embodiment of the disclosure. In this embodiment, the wafer lift pins (e.g., 253) may be lowered so that the diagnostic disc 110 rests on top of the ESC (e.g., 150). In another embodiment, another mechanism is used to guide the diagnostic disc (e.g., 110) onto the ESC (e.g., 150) such as with use of sensor data from the non-contact sensors. Each non-contact sensor 230 is brought within close proximity of the edge ring 90, but still retaining a gap between the non-contact sensor 230 and the edge ring 90. While the diagnostic disc (e.g., 110) rests on the ESC (e.g., 150), the non-contact sensor 230 may generate sensor data indicative of the degree of erosion of the edge ring and/or of the support ring and wirelessly communicate the sensor data to the controller (e.g., 109).

As observed in FIGS. 6B-6C, a support ring 390 located underneath the edge ring and between the edge ring 90 and the ESC 150 may also have erosion (or wear) when the erosion of the edge ring 90 is sufficiently deep. Accordingly, when the edge ring 90 is replaced, the support ring 390 may also be replaced at the same time, e.g., as a process kit ring.

Example 2—Diagnostic Scan to Determine Alignment of a Process Kit Ring

Figures 7A, 7B:
FIG. 7A illustrates a top, plan view, from one of the non-contact sensors disclosed herein, of edge ring and support ring surrounding an electrostatic chuck according to one embodiment of the disclosure.
FIG. 7B illustrates a perspective view of a diagnostic disc having a plurality of non-contact sensors positioned thereon and the line of sight from the non-contact sensors to an underlying chamber component according to one embodiment of the disclosure.

FIG. 7A illustrates a top, plan view, of the edge ring 90 and support ring 390 surrounding an electrostatic chuck (ESC) 150 according to one embodiment of the disclosure. The ESC 150 may include a flat region 800 (or other notch or registration feature) along a circumference of an edge of the ESC 150 used to align wafers that are placed thereon. In a similar way, the support ring 390 may include a corresponding flat region (or notch or registration feature) so that when the support ring 390 and edge ring 90 are replaced as a ring kit, the entire ring kit may be oriented along the flat region 800 and thus properly secured into place centered around the ESC 150 of the processing chamber 107.

In embodiments of the disclosure, the controller 109 may receive sensor data from any of the non-contact sensor described herein in which the controller 109 may determine, from the sensor data, whether the flat regions are mutually aligned during ring kit replacement. If the flat regions are not properly aligned, the controller 109 may signal to the transfer chamber robot 112 to withdraw the ring kit from the processing chamber 107, which may then be realigned at the end effector of the robot arm before being reinserted into the processing chamber 107.

For example, the controller 109 may determine a rotational error, which may be a rotational angle between the target orientation and a current orientation of the ring kit. The controller 109 may send instructions to the transfer chamber robot 112 to cause the transfer chamber robot 112 to rotate the end effector (and ring kit supported on the end effector) a prescribed amount to correct for and eliminate the rotational error. The transfer chamber robot 112 may then place the edge ring 90 into the processing chamber 107 through a corresponding port 108 with the correct orientation. Accordingly, the rotational error of the edge ring 90 may be eliminated using the degrees of freedom of the transfer chamber robot 112 without use of an aligner station.

In some embodiments, the transfer chamber robot 112 can correct up to a threshold amount of rotational error of the edge ring 90. For example, one transfer chamber robot 112 may be able to correct up to a 5 degree rotational error, while other factory transfer chamber robots 112 may be able to correct up to a 3 degree rotational error, a 7 degree rotational error, or some other amount of rotational error. If the detected rotational error is greater than the threshold amount of rotational error that can be corrected by the transfer chamber robot 112, then the transfer chamber robot 112 may place the ring kit at an interim station (not shown), reposition the end effector, and then pick back up the ring kit in a manner that either eliminates the rotational error or reduces the rotational error so that it is less than or equal to the threshold amount of rotational error that can be corrected based on rotation of the end effector.

In other embodiments of the disclosure, the controller 109 may receive sensor data from any of the non-contact sensor described herein in which the controller 109 may determine, from the sensor data, whether the process kit rings are offset (i.e., off-centered) during ring kit replacement. The alignment and concentricity of the process kit rings may be determined through analysis of the gap between the edge ring 90 and support ring 390 or between the edge ring 90 and the ESC 150. To generate sensor data indicative of the gap between the edge ring 90 and support ring 390 or between the edge ring 90 and the ESC 150, one non-contact sensor (e.g., camera) may be placed in a position that provides a clear line of sight to the edge of the flat 800 and beginning of circular edge of the ESC 150 and the remaining non-contact sensors (e.g., cameras) may be places in positions that provide a clear line of sight to the ring section of edge ring 90 and support ring 390.

Processing the sensor data generated by these cameras may provide at least some of the following information: that the rings are in place, that the rings comprise the right materials, the angle of rotation between the ESC flat and the ring flat, four points of gap between the inner edge of the process ring and outer edge of ESC 150, concentricity, and the like.

For instance, if the flat regions of the ESC and the ring kit are not properly centered, the controller 109 may signal to the transfer chamber robot 112 to withdraw the ring kit from the processing chamber 107, which may then be realigned at the end effector of the robot arm before being reinserted into the processing chamber 107.

For example, the controller 109 may determine a placement error, which may be a gap between the edge ring and the support ring that is outside of a target gap range. The controller 109 may send instructions to the transfer chamber robot 112 to cause the transfer chamber robot 112 to move the end effector (and ring kit supported on the end effector) a prescribed amount and in a prescribed direction to correct for and eliminate the placement error. The transfer chamber robot 112 may then place the edge ring 90 into the processing chamber 107 through a corresponding port 108 with the correct orientation. Accordingly, the placement error of the edge ring 90 may be eliminated using the degrees of freedom of the transfer chamber robot 112 without use of an aligner station.

In some embodiments, the transfer chamber robot 112 can correct up to a threshold amount of placement error of the edge ring 90. If the detected placement error is greater than the threshold amount of placement error that can be corrected by the transfer chamber robot 112, then the transfer chamber robot 112 may place the ring kit at an interim station (not shown), reposition the end effector, and then pick back up the ring kit in a manner that either eliminates the placement error or reduces the placement error so that it is less than or equal to the threshold amount of placement error that can be corrected based on movement of the end effector.

FIG. 7B illustrates a viewing position of a diagnostic disc (e.g., 110) configured to view positioning of a process kit ring (such as alignment and concentricity) according to an embodiment of the disclosure. The diagnostic disc is illustrated at a vertical distance above the ESC (e.g., 150). The diagnostic disc (e.g., 110) may reach the depicted viewing position when sitting in a transfer robot's arm (e.g., such as end effector of a transfer robot 112), or when sitting on wafer lift pins (e.g., 253).

In the depicted embodiment, the diagnostic disc has four high resolution cameras (i.e., non-contact sensors) that capture sensor data of the edge and curvature of the process kit ring according to an exemplary embodiment of the disclosure. In the depicted viewing position, the first camera 730A is positioned above flat region 800 of ESC 150 with its line of sight on the flat region 800 where it can capture the beginning of the curvature of the kit ring. In the depicted viewing position, the second camera 730B, the third camera 730C, and the fourth camera 730D, are all positioned above the edge of the kit ring diameter. Such sensor data could assist a controller 109 in determining alignment and concentricity of a ring kit, for instance, as described with respect to FIG. 7A above.

Figure 8:
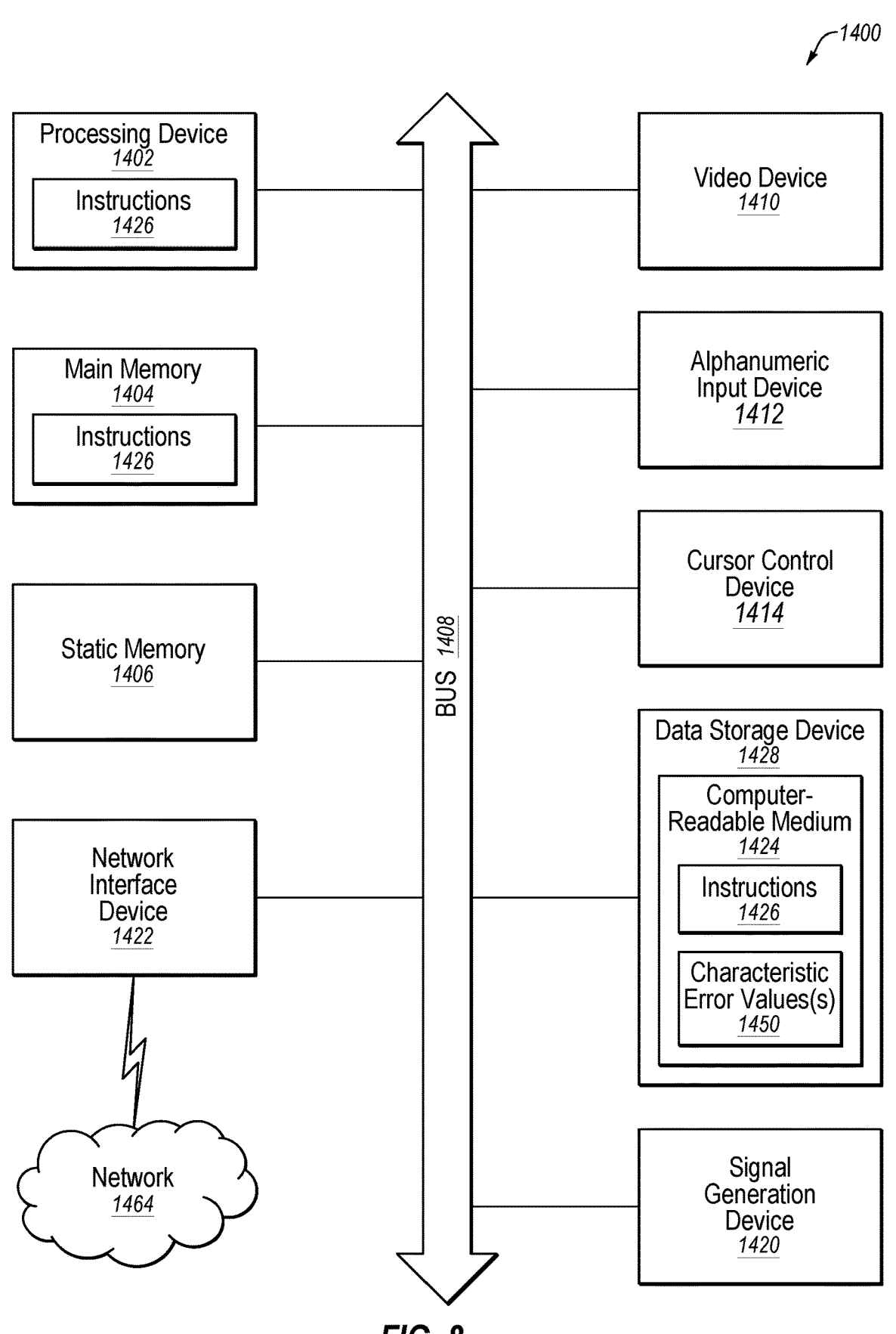
FIG. 8 is an example computing device that may operate as a controller for an electronics processing system, in accordance with embodiments of the present disclosure.

FIG. 8 is an example computing device 1400 that may operate as a system controller for an processing system (e.g., processing system 100 in FIG. 1A), in accordance with embodiments of the present disclosure. The computing device 1400 is a machine within which a set of instructions, for causing the machine to perform any one or more of the methodologies discussed herein, may be executed. In alternative embodiments, the machine may be connected (e.g., networked) to other machines in a Local Area Network (LAN) 1464, an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In an embodiment, computing device 1400 corresponds to system controller 109 of FIG. 1A. In one embodiment, system controller 109 is a component of computing device 1400.

The example computing device 1400 includes a processing device 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a secondary memory (e.g., a data storage device 1412), which communicate with each other via a bus 1408.

Processing device 1402 represents one or more general-purpose processors such as a microprocessor, central processing unit, or the like. More particularly, the processing device 1402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. Processing device 1402 is configured to execute the processing logic (instructions 1426) for performing the operations discussed herein. In one embodiment, system controller 109 corresponds to processing device 1402. In embodiments, processing device 1402 executes instructions 1426 to implement method 400 in embodiments.

The computing device 1400 may further include a network interface device 1408. The computing device 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), and a signal generation device 1420 (e.g., a speaker).

The data storage device 1428 may include a machine-readable storage medium (or more specifically a computer-readable storage medium) 1424 on which is stored one or more sets of instructions 1426 embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting computer-readable storage media.

The computer-readable storage medium 1424 may also be used to store instructions 1426 and/or characteristic error values 1450 useful for analyzing sensor data in detecting, for example, alignment, concentricity, degrees of erosion, degrees of cleanliness of components within the processing chambers 107, whether components within the processing chamber are stuck or broken, and so on. While the computer-readable storage medium 1424 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium other than a carrier wave that is capable of storing or encoding a set of instructions for execution by the machine and that cause the machine to perform any one or more of the methodologies described herein. The term "computer-readable storage medium" shall accordingly be taken to include, but not be limited to, the non-transitory media including solid-state memories, and optical and magnetic media.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   establishing, by a diagnostic disc, a secure wireless connection with a computing system using a wireless communication circuit of the diagnostic disc before or after the diagnostic disc is placed into a processing chamber;
   generating, by at least one non-contact sensor of the diagnostic disc, sensor data of a component disposed within the processing chamber;
   storing the sensor data in a memory of the diagnostic disc;
   wirelessly transmitting the sensor data to the computing system, using the wireless communication circuit;
   terminating the secure wireless connection with the computing system; and
   clearing the sensor data from the memory of the diagnostic disc.

2. The method of claim 1, wherein the sensor data comprises image data.

3. The method of claim 2, further comprising:

capturing a first image of a first portion of the component disposed within the processing chamber; and capturing a second image of a second portion of the component.

4. The method of claim 1, wherein the generating of the sensor data is performed in at least one of vacuum or a temperature of –20° C. to 120° C. while the diagnostic disc is in the processing chamber.

5. The method of claim 1, wherein the component is at least one of a process kit ring, a single ring, a substrate support assembly, an electrostatic chuck (ESC), a chamber wall, a base, a gas line, a gas distribution plate, a face plate, a showerhead, a nozzle, a lid, a liner, a liner kit, a shield, a plasma screen, a remote plasma source, a flow equalizer, a cooling base, a chamber viewport, or a chamber lid.

6. The method of claim 1, further comprising:

illuminating, by an illumination component of the diagnostic disc, the component disposed within the processing chamber.

7. The method of claim 1, further comprising:

analyzing, by the computing system, the sensor data to determine at least one of alignment, concentricity, degree of cleanliness, or degree of erosion of the component.

8. The method of claim 7, further comprising at least one of:

initiating automated correction of the alignment or concentricity of the component responsive to determining that the alignment or concentricity is skewed, initiating automated cleaning of the component responsive to determining that the degree of cleanliness meets a contamination threshold, or initiating automated replacement of the component responsive to determining that the degree of erosion meets an end-of-life threshold.

9. The method of claim 1, further comprising:

receiving, by the diagnostic disc, a script from the computing system, through which the diagnostic disc is instructed to perform associated functions.

\* \* \* \* \*